(12) United States Patent
Hayakawa et al.

(10) Patent No.: US 8,401,352 B2
(45) Date of Patent: Mar. 19, 2013

(54) OPTICAL WAVEGUIDE DEVICE, ITS MANUFACTURE METHOD, LASER MODULE AND OPTICAL TRANSMISSION SYSTEM

(75) Inventors: Akinori Hayakawa, Kawasaki (JP); Takuya Fujii, Yamanashi (JP)

(73) Assignees: Fujitsu Limited, Kawasaki (JP); Sumitomo Electric Device Innovations, Inc., Yamanashi (JP)

( * ) Notice: Subject to any disclaimer, the term of this patent is extended or adjusted under 35 U.S.C. 154(b) by 416 days.

(21) Appl. No.: 12/724,860

(22) Filed: Mar. 16, 2010

(65) Prior Publication Data

US 2010/0247031 A1   Sep. 30, 2010

(30) Foreign Application Priority Data

Mar. 25, 2009 (JP) ................................. 2009-074767

(51) Int. Cl.
  *G02B 6/26* (2006.01)
  *G02B 6/12* (2006.01)
(52) U.S. Cl. ........................................... 385/50; 385/14
(58) Field of Classification Search ...................... 385/50
  See application file for complete search history.

(56) References Cited

U.S. PATENT DOCUMENTS

| | | | |
|---|---|---|---|
| 6,228,670 B1 | 5/2001 | Kudo | |
| 6,480,640 B1 | 11/2002 | Shimonaka et al. | |
| 6,597,823 B2 * | 7/2003 | Shimonaka et al. | 385/14 |
| 2007/0258495 A1 * | 11/2007 | Hamamoto et al. | 372/44.01 |
| 2011/0149381 A1 * | 6/2011 | Hatakeyama | 359/341.1 |

FOREIGN PATENT DOCUMENTS

| | | |
|---|---|---|
| EP | 1775640 A1 | 4/2007 |
| JP | 10-160951 A | 6/1998 |
| JP | 10-332964 A | 12/1998 |
| JP | 11-064656 A | 3/1999 |
| JP | 11-223739 A | 8/1999 |
| JP | 2000-012952 A | 1/2000 |
| JP | 2002-118324 A | 4/2002 |
| JP | 2002-311267 A | 10/2002 |

OTHER PUBLICATIONS

Supplementary European Search Report dated May 11, 2011, issued in corresponding European Patent Application No. 09750481.5.
Japanese Office Action dated Oct. 23, 2012, issued in corresponding Japanese Patent Application No. 2009-074767, (3 pages). With English Translation.

* cited by examiner

*Primary Examiner* — Omar Rojas
(74) *Attorney, Agent, or Firm* — Westerman, Hattori, Daniels & Adrian, LLP

(57) ABSTRACT

A first optical waveguide of a convex shape is formed over a substrate. A second optical waveguide of a convex shape is formed over the substrate. A multimode interference waveguide of a convex shape is formed over the substrate for optically coupling the first optical waveguide to the second optical waveguide. Either side of the first optical waveguide is filled with a filling material, but either side of the second optical waveguide is not filled with the filling material.

10 Claims, 33 Drawing Sheets

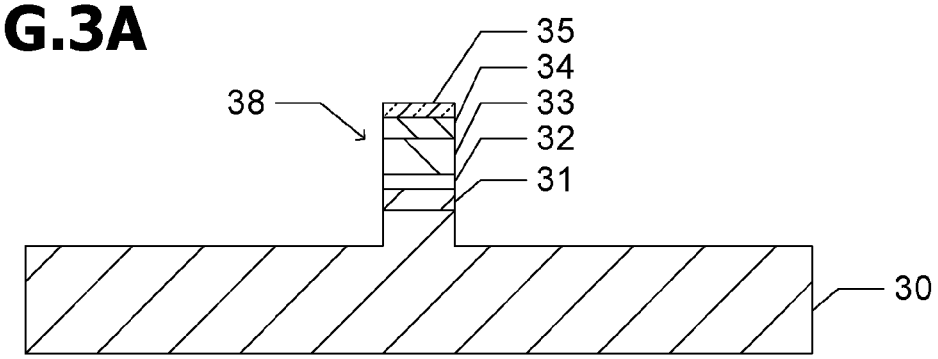
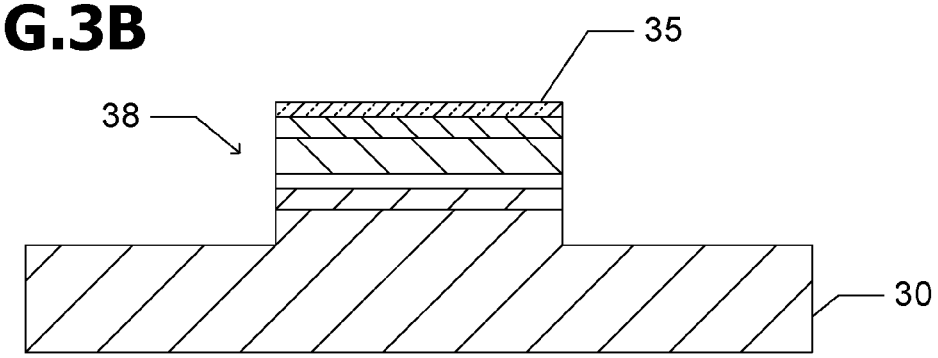
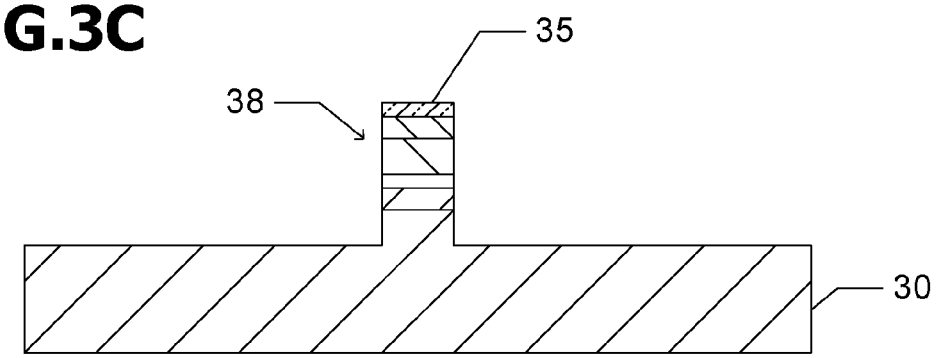

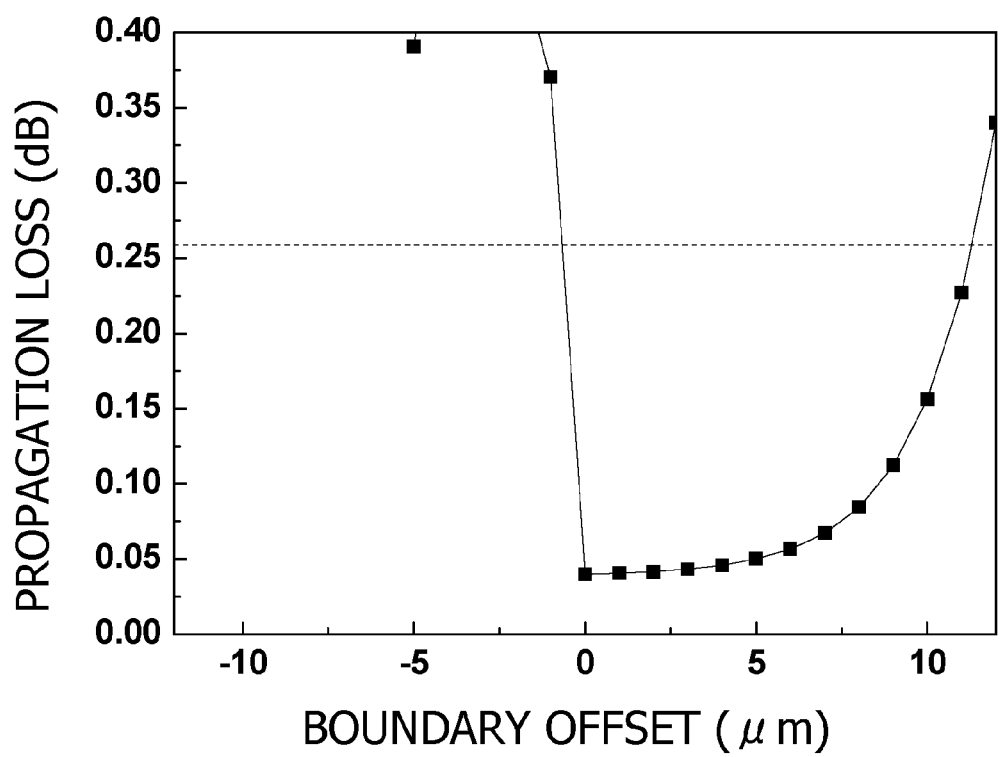

OPTICAL WAVEGUIDE DEVICE, ITS MANUFACTURE METHOD, LASER MODULE AND OPTICAL TRANSMISSION SYSTEM

CROSS-REFERENCE TO RELATED APPLICATION

This application is based upon and claims the benefit of priority of the prior Japanese Patent Application No. 2009-074767, filed on Mar. 25, 2009, the entire contents of which are incorporated herein by reference.

FIELD

The embodiments discussed herein are related to an optical waveguide device including a first optical waveguide and a second optical waveguide which are coupled to each other, either side of the first optical waveguide being filled with filling material having a relatively high refractive index, its manufacture method, a laser module using the optical waveguide, and an optical transmission system using the optical waveguide.

BACKGROUND

In the field of communication optical semiconductor devices, rather than the development of an optical device having a single function such as a Fabry-Perot laser device, a distributed feedback (DFB) laser device, a semiconductor optical amplifier and an optical modulator, attention has been paid to the development of a multifunction integrated optical device formed on a single substrate. A semiconductor buried waveguide is suitable for a waveguide of a current injection type optical semiconductor device such as a semiconductor laser device and a semiconductor optical amplifier, the semiconductor buried waveguide having a semiconductor filling material that fills either side of a mesa (convex) waveguide. As this semiconductor buried waveguide is adopted, stress contained in each region of the waveguide becomes small, so that it becomes possible to ensure high long-term reliability.

A so-called high mesa waveguide is effective for an optical modulator operating at high speed of several GHz to several tens GHz, the high mesa waveguide having a mesa waveguide, either side of which is filled with air or organic material of a low refractive index. Air and a low refractive index organic material have a dielectric constant lower than that of a semiconductor filling material, so that parasitic capacitance can be reduced. The high mesa waveguide is also suitable for a multimode interference waveguide, a curved waveguide and the like. Since either side of a waveguide is filled with a low refractive index material, it becomes possible to obtain high optical confinement effects. It is therefore possible to realize miniaturization and low loss.

An optical device has been proposed, integrating a buried waveguide and a high mesa waveguide on one substrate (Patent Documents 1 to 4). As the buried waveguide and the high mesa waveguide are coupled, a guided mode mismatch occurs due to discontinuity of refractive indices. The guided mode mismatch may cause reflection and scattering of guided light. As reflected light returns to a semiconductor laser device, the operation characteristics of the semiconductor laser device may be deteriorated.

It is possible to relax the guided mode mismatch by introducing a taper structure to a connection region between a buried waveguide and a high mesa waveguide (Patent Document 5).

PATENT DOCUMENTS

1. Japanese Laid-open Patent Publication No. 2000-12952
2. Japanese Laid-open Patent Publication No. 11-64656
3. Japanese Laid-open Patent Publication No. 2002-118324
4. Japanese Laid-open Patent Publication No. 10-332964
5. Japanese Laid-open Patent Publication No. 2002-311267

SUMMARY

In introducing the taper structure to a connection region between a buried waveguide and a high mesa waveguide, a high position alignment precision relative to the already formed waveguides is required when the taper structure is formed.

According to one aspect of the present invention, there is provided an optical waveguide device including:

a first optical waveguide of a convex shape formed over a substrate, either side of the first optical waveguide being filled with a filling material;

a second optical waveguide of a convex shape formed over the substrate, either side of the first optical waveguide not being filled with the filling material;

a multimode interference waveguide of a convex shape formed over the substrate for optically coupling the first optical waveguide to the second optical waveguide.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A to 7D are diagrams of the optical waveguide device of the first embodiment during manufacture, FIGS. 2A, 3A, 4A, 5A, 6A and 7A correspond to cross sectional views taken along one-dot chain line 2A-2A in FIG. 1, FIGS. 2B, 3B, 4B, 5B, 6B and 7B correspond to cross sectional views taken along one-dot chain line 2B-2B in FIG. 1, FIGS. 2C, 3C, 4C, 5C, 6C and 7C correspond to cross sectional views taken along one-dot chain line 2C-2C in FIG. 1, and FIGS. 5D, 6D and 7D are plane views corresponding to manufacturing stages of FIGS. 5A to 5C, FIGS. 6A to 6C and FIGS. 7A to 7C, respectively.

FIG. 8 is a graph illustrating the relation between an offset amount of a boundary and a propagation loss of the optical waveguide device of the first embodiment.

DESCRIPTION OF EMBODIMENTS

With reference to the accompanying drawings, the first to sixth embodiments will be described.

Embodiment 1

Figure 1:
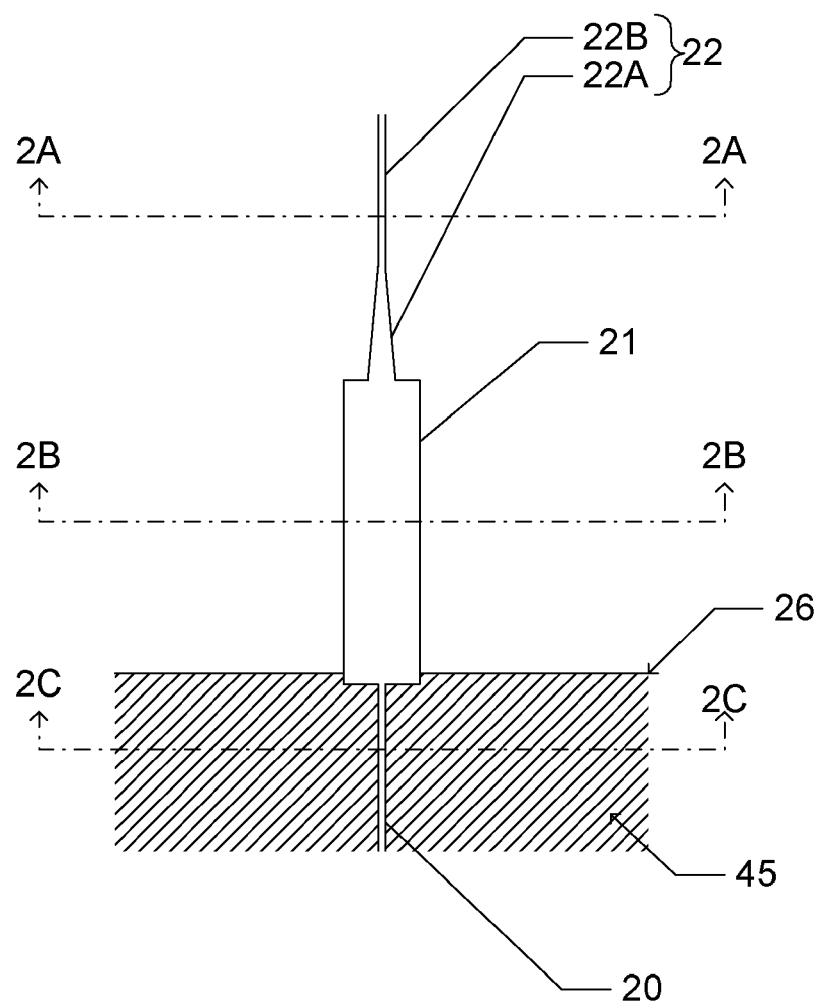
FIG. 1 is a plane view of an optical waveguide device according to a first embodiment.

FIG. 1 is a plane view of an optical waveguide device of the first embodiment. A buried waveguide 20 of a convex shape and a high mesa waveguide 22 of a convex shape are formed on a substrate. A multimode interference waveguide (MMI) 21 optically couples together the buried waveguide 20 to the high mesa waveguide 22. A planar shape of the multimode interference waveguide 21 is, for example, rectangular. One shorter side of the multimode interference waveguide 21 is an input terminal, and the other shorter side is an output terminal. The buried waveguide 20 is coupled to the center of the input terminal side of the multimode interference waveguide 21, and the high mesa waveguide 22 is coupled to the center of the output terminal side.

A semiconductor filling material 45 is disposed on either side of a mesa including the buried waveguide 20. Either side of the high mesa waveguide 22 is filled with a low refractive index medium having a refractive index lower than that of the filling material 45, e.g., gas such as air, organic material or the like.

A boundary 26 is defined at a position that is out of alignment from the contact point between the buried waveguide 20 and the multimode interference waveguide 21 toward the multimode interference waveguide 21. The filling material 45 is disposed at either side of the multimode interference waveguide 21 in the regions extending from the boundary 26 toward the buried waveguide 20, and the regions extending from the boundary 26 toward the high mesa waveguide 22 are filled with the low refractive index medium.

The high mesa waveguide 22 includes a taper portion 22A continuous with the multimode interference waveguide 21 and a constant width portion 22B continuous with the taper portion 22A. The taper portion 22A tapers toward the constant width portion 22B from the contact point between the high mesa waveguide 22 and a multimode interference waveguide 21. A width of the constant width portion 22B is constant, and equal to the width of the taper portion 22A at the remotest position from the multimode interference waveguide 21.

If a wavelength of guided light is within a 1.55 μm band, for example, widths of the buried waveguide 20 and the constant width portion 22B of the high mesa waveguide 22 are 1.4 μm, a width and a length of the multimode interference waveguide 21 are 5 μm and 56 μm, respectively, a width of the taper portion 22A at the contact point between the high mesa waveguide 22 and the multimode interference waveguide 21 is 2.0 μm, and a length of the taper portion 22B is 30 μm. Namely, the width of the high mesa waveguide 22 at the contact point between the high mesa waveguide 22 and multimode interference waveguide 21 is wider than the width of the buried waveguide 20 at the contact point between the buried waveguide 20 and the multimode interference waveguide 21.

Figure 5A:
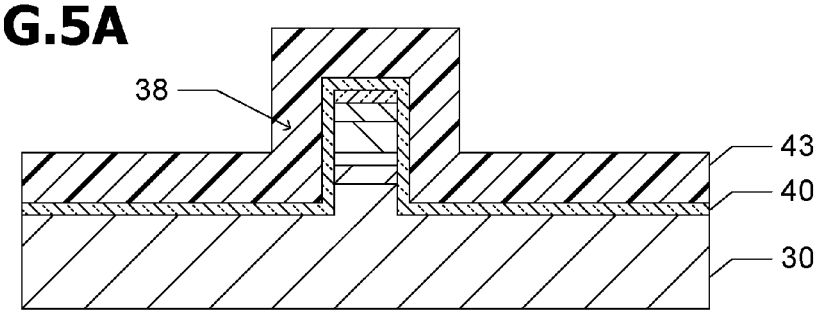
Figure 5B:
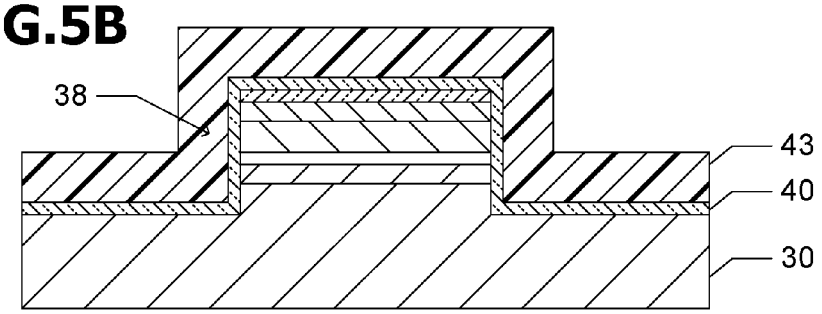
Figure 5C:
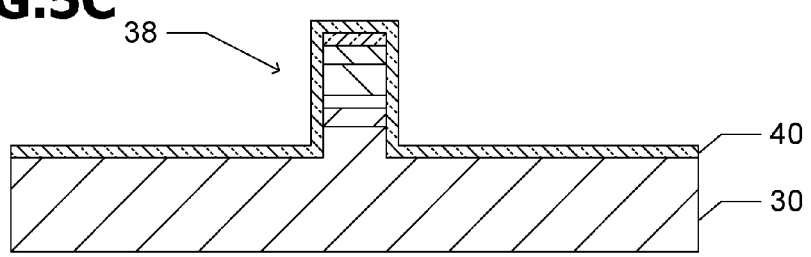
Figure 5D:
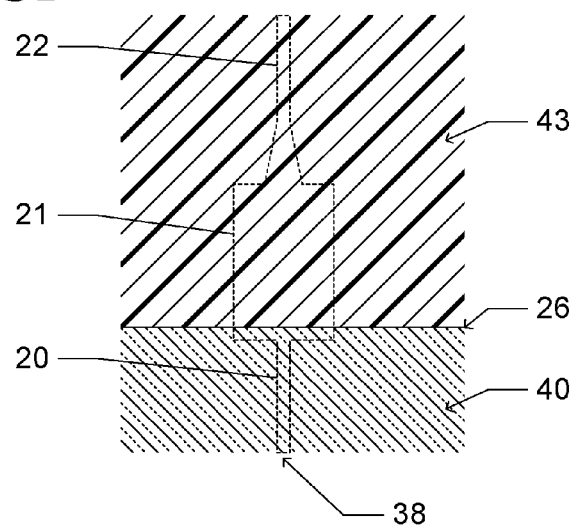
Figure 6A:
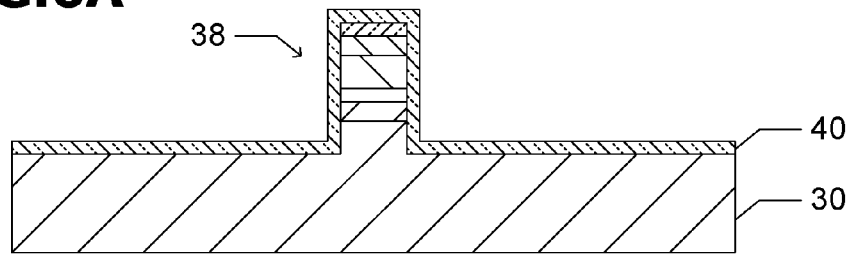
Figure 6B:
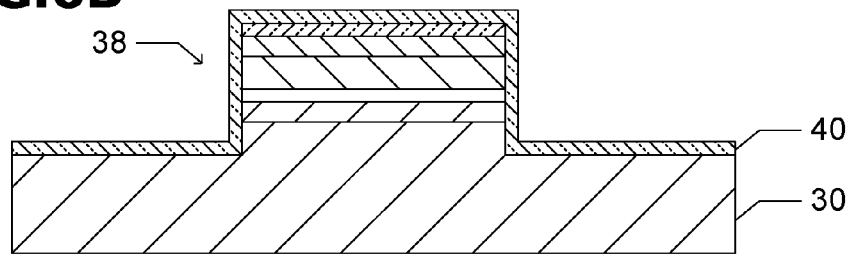
Figure 6C:
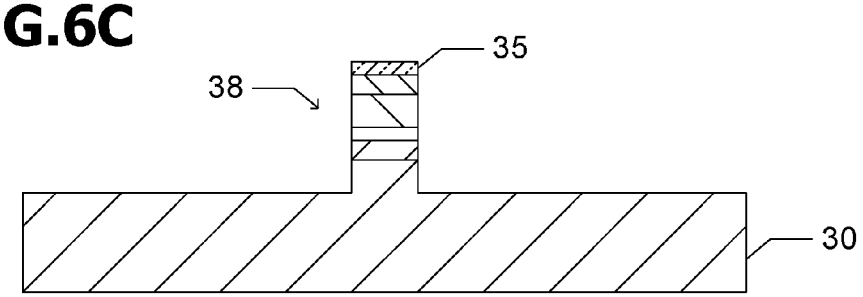
Figure 6D:
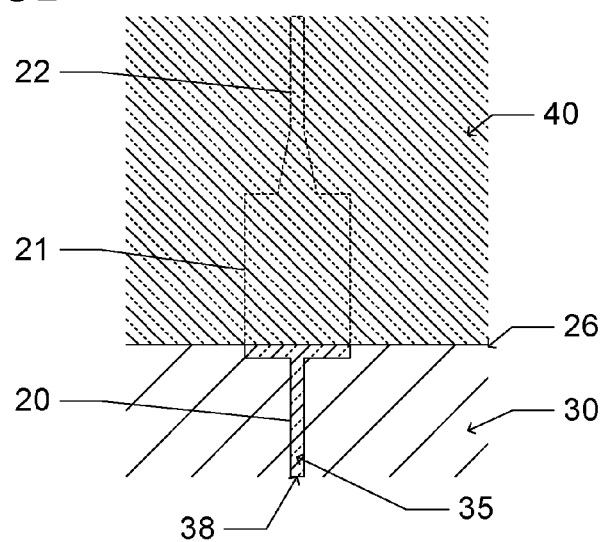
Figure 7A:
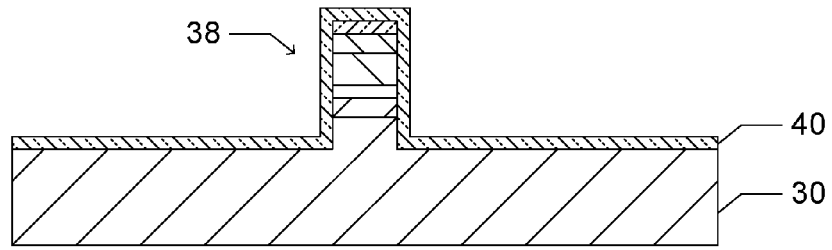
Figure 7B:
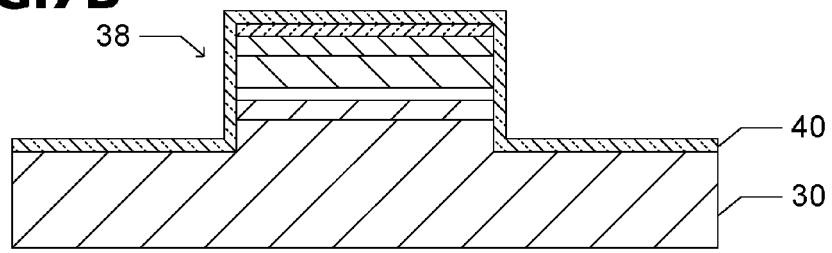
Figure 7C:
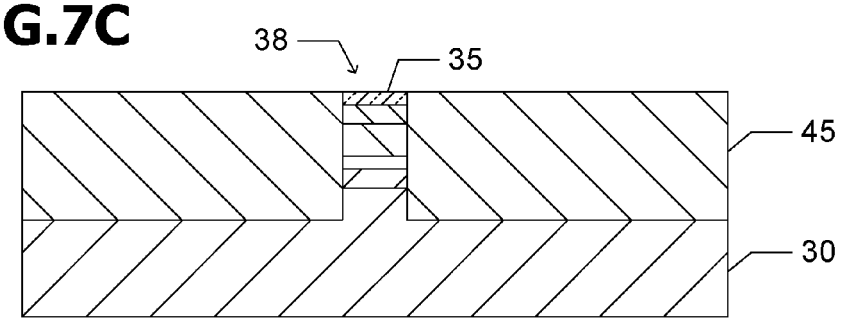
Figure 7D:
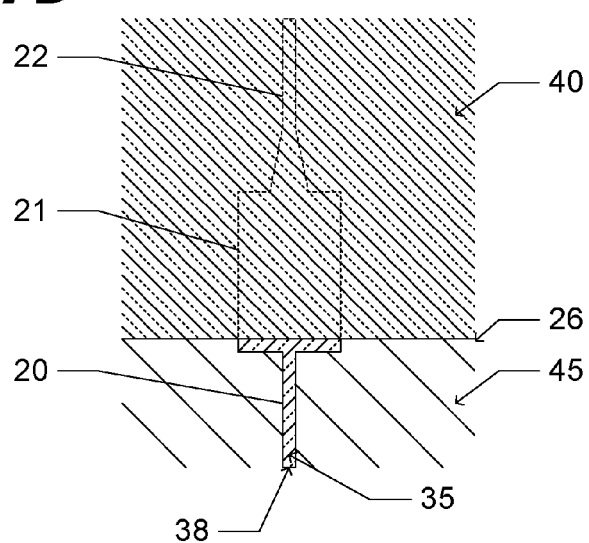

With reference to FIGS. 2A to 7D, description will be made on a manufacture method for the optical waveguide of the first embodiment. Cross sectional views of FIGS. 2A to 2C, FIGS. 3A to 3C, FIGS. 4A to 4C, FIGS. 5A to 5C, FIGS. 6A to 6C and FIGS. 7A to 7C are cross sectional views of the optical waveguide device at the same stages during manufacture, respectively. FIGS. 2A, 3A, 4A, 5A, 6A and 7A correspond to cross sectional views taken along one-dot chain line 2A-2A in FIG. 1, FIGS. 2B, 3B, 4B, 5B, 6B and 7B correspond to cross sectional views taken along one-dot chain line 2B-2B in FIG. 1, and FIGS. 2C, 3C, 4C, 5C, 6C and 7C correspond to cross sectional views taken along one-dot chain line 2C-2C in FIG. 1. FIGS. 5D, 6D and 7D are plane views of the optical waveguide device during manufacture.

Figure 2A:
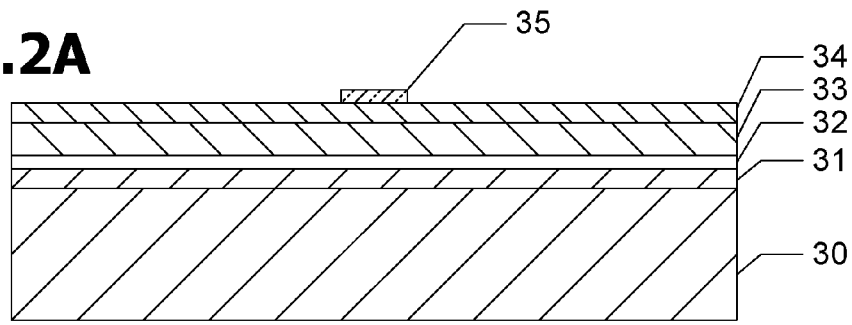
Figure 2B:
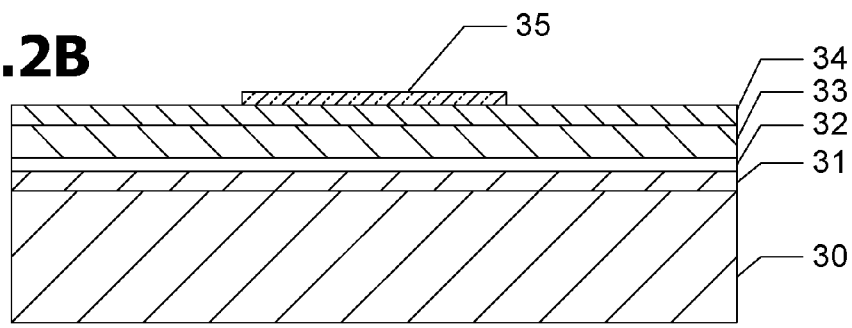
Figure 2C:
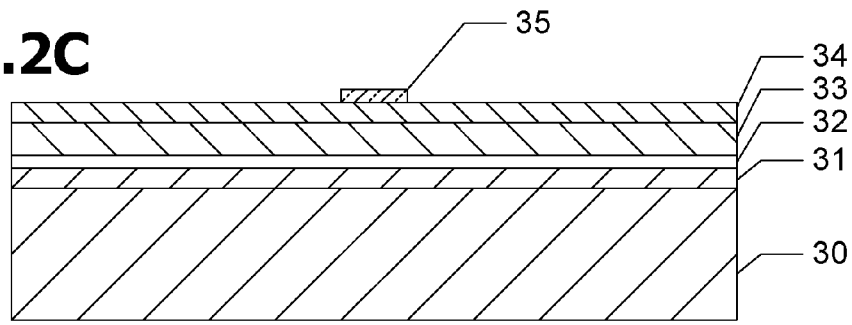

As illustrated in FIGS. 2A to 2C, a lower cladding layer 31, a core layer 32, an upper cladding layer 33 and a contact layer 34 are epitaxially grown on an n-type InP semiconductor substrate 30 by metal organic chemical vapor deposition (MOCVD). The lower cladding layer 31 is made of n-type InP and has a thickness of 300 nm. The core layer 32 is made of non-doped InGaAsP having a composition corresponding to a transition wavelength of 1.3 μm and has a thickness of 230 nm. The upper cladding layer 33 is made of p-type InP and has a thickness of 1 μm. The contact layer 34 is made of p-type InGaAs and has a thickness of 300 nm. A refractive index of the core layer 32 is higher than those of the lower cladding layer 31 and upper cladding layer 33.

A mesa mask pattern 35 of silicon oxide is formed on the contact layer 34. The mesa mask pattern 35 is formed by patterning a silicon oxide film deposited by chemical vapor deposition (CVD), by utilizing photolithography techniques. A planar shape of the mesa mask pattern 35 matches the planar shapes of the buried waveguide 20, the multimode interference waveguide 21 and the high mesa waveguide 22 illustrated in FIG. 1.

As illustrated in FIGS. 3A to 3C, by using the mesa mask pattern 35 as an etching mask, the layers from the contact layer 34 to the surface layer of the semiconductor substrate 30 are etched. For example, reactive ion etching using inductively coupled plasma (ICP-RIE) is applied for this etching. For example, $SiCl_4$ is used as an etching gas. This etching forms a mesa 38, including the lower cladding layer 31, the core layer 32, the upper cladding layer 33 and the contact layer 34, on the surface of the semiconductor substrate 30. A height of the mesa 38 excluding the mesa mask pattern 35 is, e.g., 3 μm.

Figure 4A:
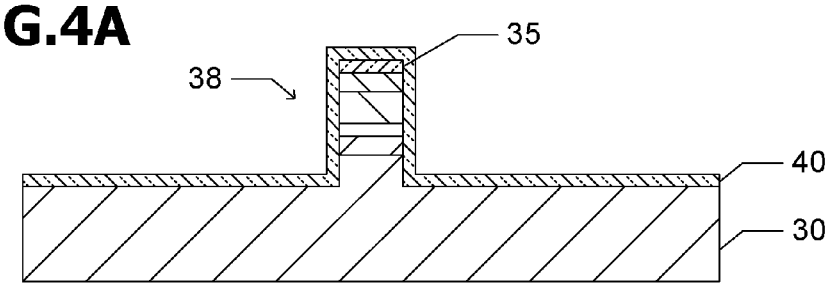
Figure 4B:
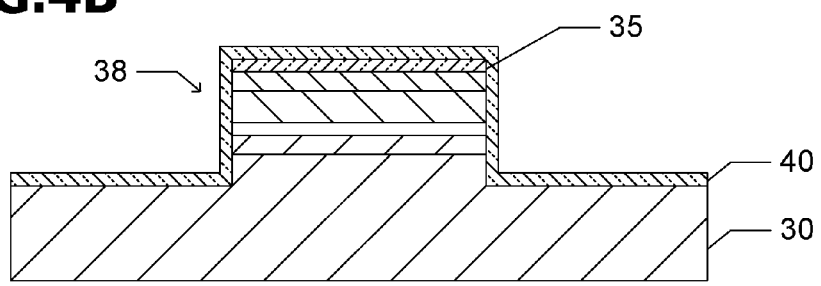
Figure 4C:
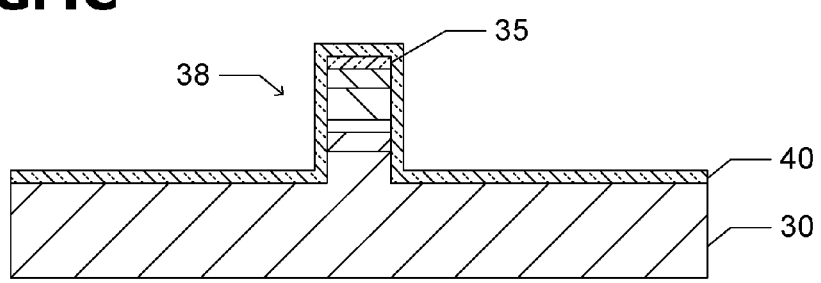

As illustrated in FIGS. 4A to 4C, a selective growth mask film 40 of silicon nitride is formed on the upper surface of the semiconductor substrate 30 and side walls and the upper surface of the mesa 38, for example, by plasma CVD. It is possible to etch the selective growth mask film 40 of silicon nitride formed by plasma CVD at etching rate faster than that of the mesa mask pattern 35 of silicon oxide, by controlling film forming conditions.

As illustrated in FIGS. 5A to 5C, photoresist is coated on the selective growth mask film 40, exposed and developed to form a photoresist pattern 43.

FIG. 5D is a plane view illustrating the structure that the photoresist pattern 43 is formed. The photoresist pattern 43 covers the region extending from the boundary 26 toward the high mesa waveguide 22. The selective growth mask film 40 is exposed in the region extending from the boundary 26 toward the buried waveguide 20.

By using the photoresist mask 43 as an etching mask, the selective growth mask film 40 is etched. After this etching, the photoresist pattern 43 is removed.

As illustrated in FIGS. 6A to 6C, the selective growth mask film 40 is exposed in the region which had been covered with the photoresist pattern 43, whereas the selective growth mask film 40 is removed in the region which had not been covered with the photoresist pattern 43.

FIG. 6D is a plane view illustrating the structure after the photoresist pattern 43 was removed. The region extending from the boundary 26 toward the high mesa waveguide 22 remains covered with the selective growth mask film 40. The mesa mask pattern 35, side walls of the mesa 38 and the upper surface of the semiconductor substrate 30 are exposed in the region extending from the boundary 26 toward the buried waveguide 20.

As illustrated in FIGS. 7A to 7C, by using the selective growth mask film 40 and the mesa mask pattern 35 as a mask, a semi-insulating InP filling material 45 doped with Fe or the like is selectively grown in the region exposing the semiconductor substrate 30. The upper surface of the filling material 45 is on the approximately same level with the upper surface of the mesa mask pattern 35.

FIG. 7D is a plane view illustrating the structure after the filling material 45 is selectively grown. The filling material 45 does not grow in the region exposing the selective growth mask film 40 and the mesa mask pattern 35. Therefore, the filling material 45 is formed on either side of the mesa 38 and in a region extending from the boundary 26 toward the buried waveguide 20. The filling material is not disposed on either side of the mesa 38 extending from the boundary 26 toward the high mesa waveguide 22, and these spaces are filled with air having a refractive index lower than that of the filling material 45.

Guided light input from the buried waveguide 20 to the multimode interference waveguide 21 is resolved into higher modes. The higher modes are focused again at the coupling position between the high mesa waveguide 22 and the multimode interference waveguide 21. The focused guided mode field is the same as the guided mode field in the buried waveguide 20. By widening the width of the high mesa waveguide 22 at the coupling position between the high mesa waveguide 22 and the multimode interference waveguide 21, the guided mode field in the high mesa waveguide 22 matches the guided mode field in the buried waveguide 20. It is therefore possible to reduce a loss at the coupling position between the high mesa waveguide 22 and the multimode interference waveguide 21.

By gradually narrowing waveguide width at the taper portion 22A of the high mesa waveguide 22, the guided mode field in the high mesa waveguide 22 is adjusted. Degree of mismatch between the guided mode in the buried waveguide 20 and the guided mode in the high mesa waveguide 22 is therefore relaxed, and a coupling loss is eliminated.

FIG. 8 illustrates simulation results of the relation between a distance (offset) and a propagation loss of guided light, the distance being from the coupling point between the buried waveguide 20 and the multimode interference waveguide 21 to the boundary 26. The horizontal axis represents the offset of the boundary in the unit of "μm", and the vertical axis represents a propagation loss in the unit of "dB". A direction from the coupling point between the buried waveguide 20 and the multimode interference waveguide 21 toward the multimode interference waveguide 21 is a positive direction. For comparison, a propagation loss of the structure that the constant width high mesa waveguide 22 and the buried waveguide 20 are directly coupled is indicated by a broken line.

When the offset of the boundary 26 is 0, i.e., when the boundary 26 passes through the coupling point between the buried waveguide 20 and the multimode interference waveguide 21, the propagation loss is minimum. As the offset of the boundary 26 becomes large starting from 0 μm toward the positive direction (toward the multimode interference waveguide 21), the propagation loss increases gradually. However, this increment is very small in the offset range of 0 to 5 μm.

As the position of the boundary 26 is out of alignment toward the negative direction (toward the buried waveguide 20), a propagation loss increases abruptly. This results from a discontinuous change in refractive indices at a cross point between the boundary 26 and the buried waveguide 20. Since mismatch between guided modes of guided light generates at the point where discontinuous change in refractive indices occur, reflection and scattering occur so that a propagation loss increases.

Also in the case in which the boundary 26 crosses the multimode interference waveguide 21, a refractive index changes discontinuously at the crossing region. However, a traverse direction optical intensity distribution in a region close to the input and output terminals of the multimode interference waveguide 21 is biased to the coupling position between the buried waveguide 20 and the multimode interference waveguide 21, and to the coupling position between the high mesa waveguide 22 and the multimode interference waveguide 21. Therefore, discontinuity of refractive index caused by the filling material 45 and the low refractive index medium which are disposed at either side of the multimode interference waveguide 21 has an insignificant effect on the guided light.

From the reason described above, in case that the boundary 26 intersects with the multimode interference waveguide 21, propagation loss can be suppressed compared to the case where the boundary 26 intersects with the buried waveguide 20.

As illustrated in FIG. 8, even if the boundary 26 is displaced within a range of the offset of the boundary 26 between 0 μm and 5 μm, propagation loss changes little. For example, if the optical waveguide device is designed in such a way that the offset of the boundary 26 is 2.5 μm, a position alignment margin of ±2.5 μm is ensured.

It has been found also that a propagation loss at an offset of the boundary 26 of 11 μm is smaller than the propagation loss (indicated by the broken line in FIG. 8) of a structure in which the constant width buried waveguide and the high mesa waveguide are coupled to each other directly. If the offset of the boundary is equal to or smaller than 11 μm, it is possible to make the propagation loss smaller than that of the structure in which the constant width buried waveguide and the high mesa waveguide are coupled to each other directly.

If a position alignment precision of a manufacture process is high, the offset of the boundary may be reduced. For example, if a maximum position displacement of a manufacture process is ±1 μm, the offset of the boundary may be set to 1 μm.

In the operation described above, the buried waveguide 20 is used as an input side waveguide and the high mesa waveguide 22 is used as an output side waveguide. Conversely, the buried waveguide 20 may be used as an output side waveguide and the high mesa waveguide 22 may be used as an input side waveguide.

Further, although InP based material is used in the first embodiment, other compound semiconductor materials such as GaAs based material may also be used. Mask material and the like are not limited to the materials used in the first embodiment. In the first embodiment, a wavelength of the guided light is a 1.55 µm band. The optical waveguide device may be applied to other wavelength bands of the guided light by adjusting the size and refractive index of each waveguide.

Furthermore, although the boundary 26 is a straight line perpendicular to the buried waveguide 20, a straight line oblique to the buried waveguide 20 or a curved line may also be used if the offset of the boundary 26 is proper at the contact point between the boundary 26 and multimode interference waveguide 21. The filling material 45 is disposed at least in the region where the traverse mode of the guided light exists. The filling material 45 is not required to be disposed in the region where the traverse mode of the guided light does not exist.

Embodiment 2

Figure 9:
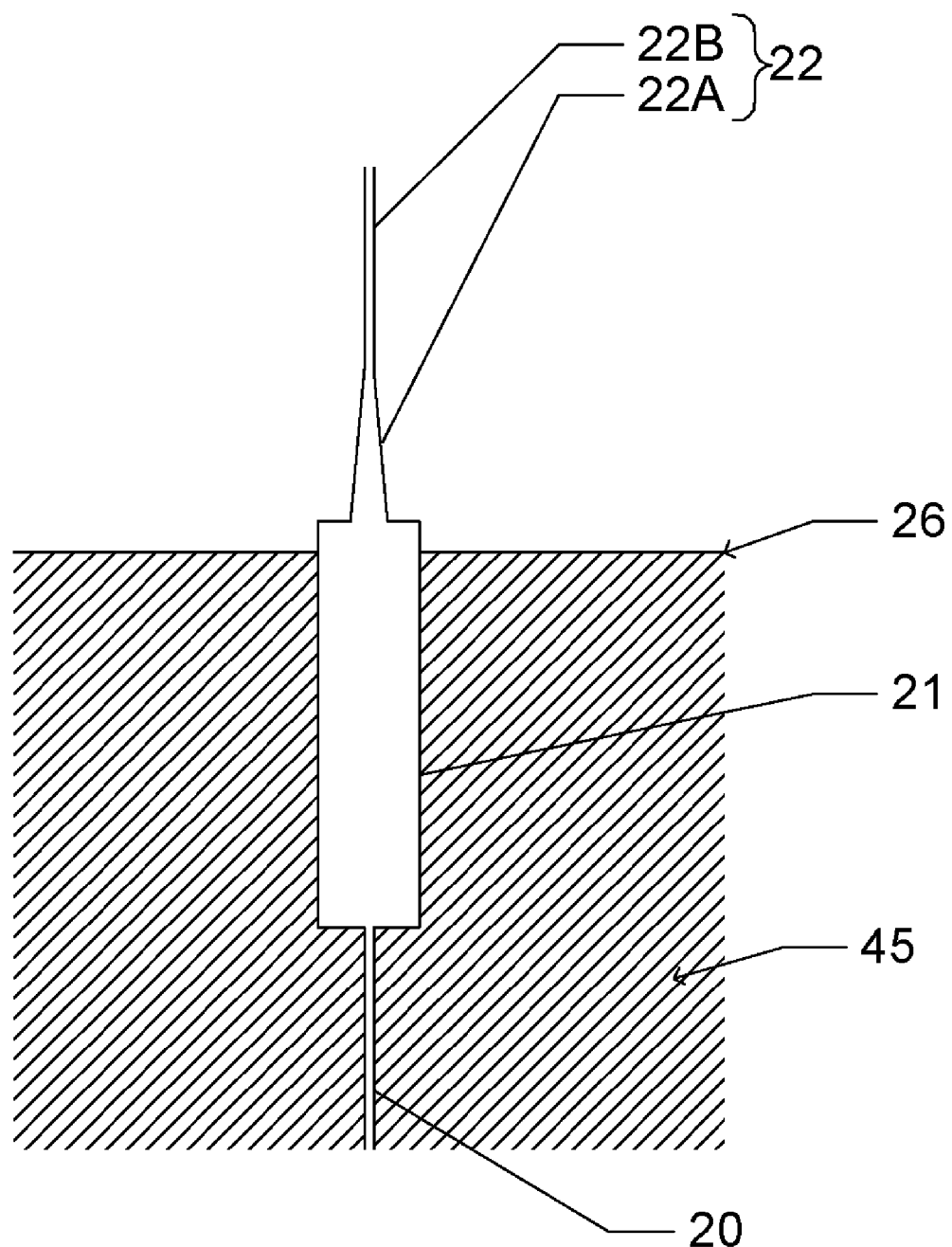
FIG. 9 is a plane view of an optical waveguide device of a second embodiment.

FIG. 9 is a plane view of an optical waveguide device of the second embodiment. In the first embodiment, the boundary 26 between the region where the filling material 45 is embedded and the region filled with the low refractive index medium is located near the coupling position between the buried waveguide 20 and the multimode interference waveguide 21. In the second embodiment, the boundary 26 is located near the coupling position between the high mesa waveguide 22 and the multimode interference waveguide 21. Namely, the boundary 26 is located at a position displaced from the coupling position between the high mesa waveguide 22 and the multimode interference waveguide 21 toward the multimode interference waveguide 21. Other structures are the same as those of the optical waveguide device of the first embodiment.

As in the case of the first embodiment, there is only a small influence of a discontinuity of the refractive index upon guided light, the discontinuity being caused by the filling material 45 and the low refractive index medium disposed at the sides of the multimode interference waveguide 21. It is therefore possible to suppress an increase in a propagation loss. A proper offset range is the same as that of the first embodiment.

If the boundary 26 is located between the input and output terminals of the multimode interference waveguide 21, it is possible to suppress an increase in a propagation loss more than that of the structure in which the constant width buried waveguide and the high mesa waveguide are coupled to each other directly.

Embodiment 3

Figure 10:
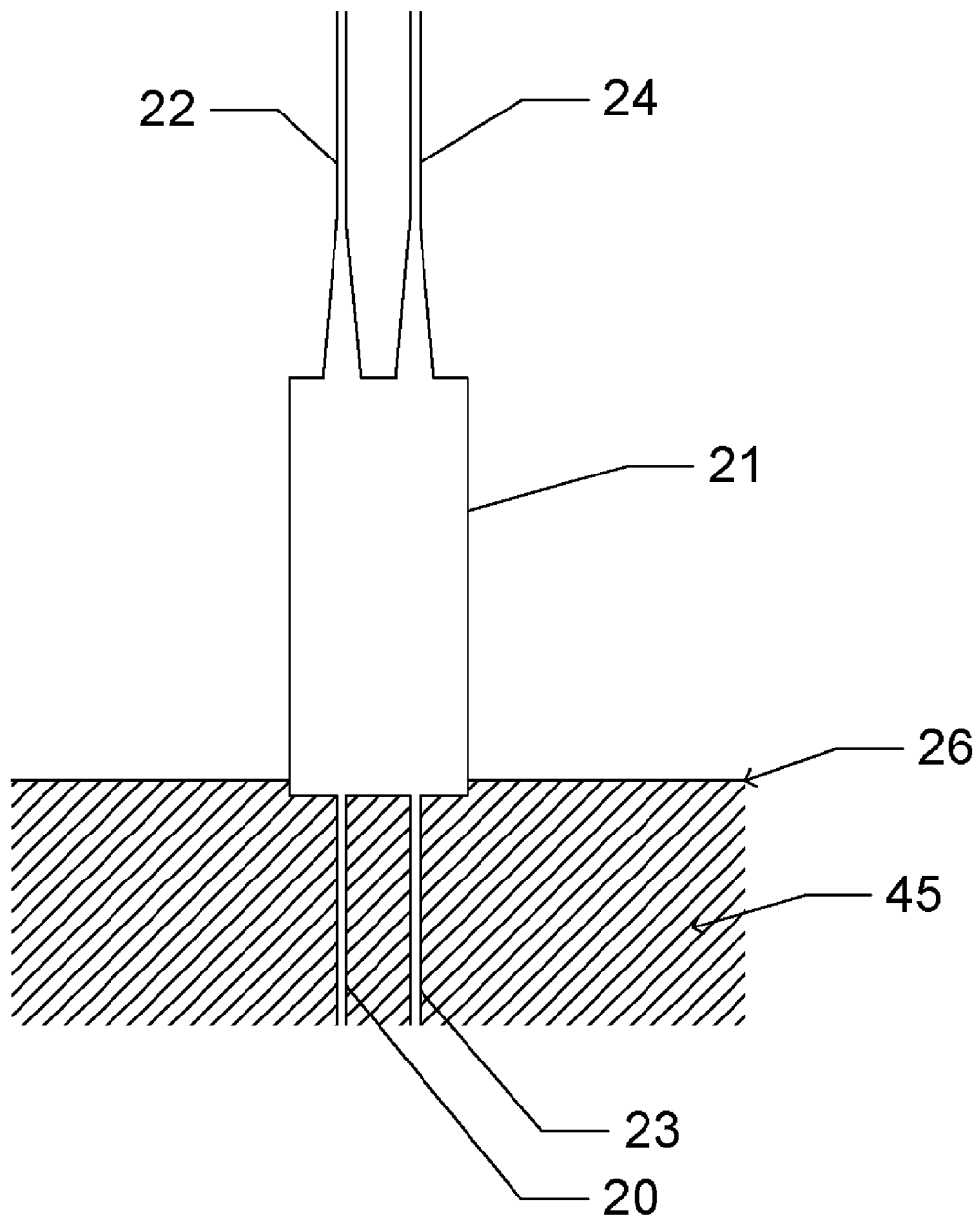
FIG. 10 is a plane view of an optical waveguide device of a third embodiment.

FIG. 10 is a plane view of an optical waveguide of the third embodiment the multimode interference waveguide 21 used for the optical waveguide device of the first embodiment has the structure of one input and one output. The multimode interference waveguide 21 used for the optical waveguide device of the third embodiment has the structure of two inputs and two outputs.

Buried waveguides 20 and 23 are connected to the input terminal of the multimode interference waveguide 21, and high mesa waveguides 22 and 24 are connected to the output terminal of the multimode interference waveguide 21. The structure of each of the buried waveguides 20 and 23 is the same as that of the buried waveguide 20 of the first embodiment, and the structure of each of the high mesa waveguides 22 and 24 is the same as that of the high mesa waveguide 22 of the first embodiment.

Lengths of the short side and the long side of the multimode interference waveguide 21 are 7.5 µm and 249.4 µm, respectively. The buried waveguides 20 and 23 are coupled to the multimode interference waveguide 21 at positions displaced by 2.75 µm from the center of the short side as the input terminal of the multimode interference waveguide 21. The high mesa waveguides 22 and 24 are located, for example, in such a manner that the center lines of the high mesa waveguides 22 and 24 are coincident with the extensions of the center lines of the buried waveguides 20 and 23, respectively. The buried waveguides 20 and 23 are coupled via the multimode interference waveguide 21 to the high mesa waveguides 22 and 24. It is not necessarily required that the center lines of the input side waveguides are coincident with the extensions of the center lines of the output side waveguides.

The boundary 26 between the region filled with the filling material 45 and the region filled with the low refractive index medium is located at the position displaced from the contact position between the buried waveguides 20, 23 and the multimode interference waveguide 21 toward the multimode interference waveguide 21, as in the case of the first embodiment.

Figure 11:
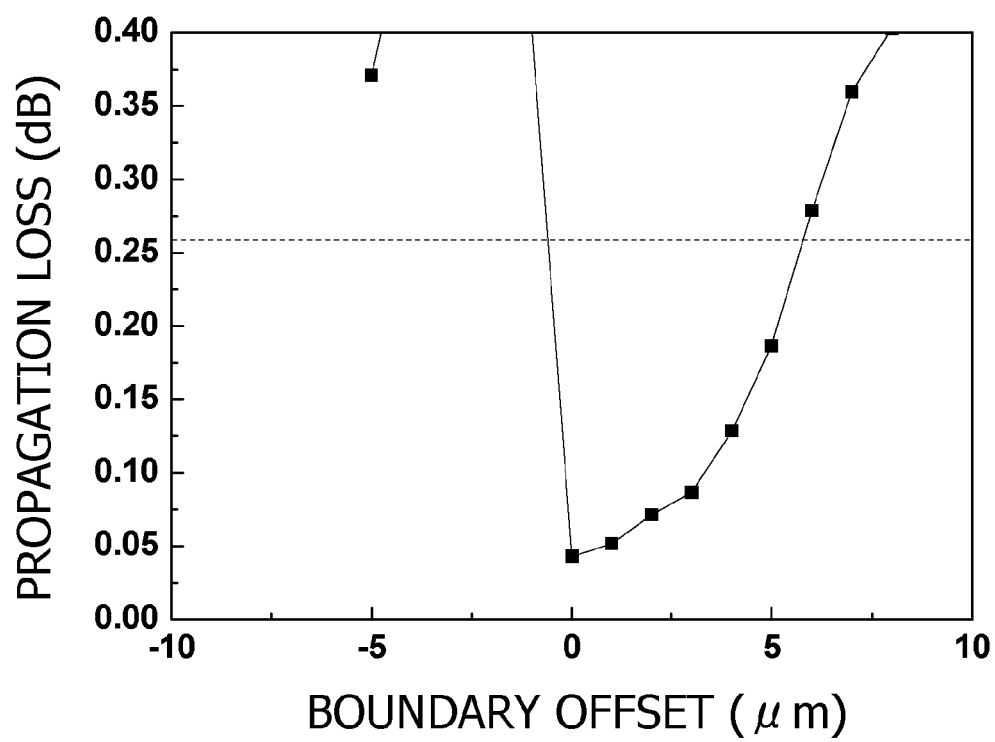
FIG. 11 is a graph illustrating the relation between an offset amount of a boundary and a propagation loss of the optical waveguide device of the third embodiment.

FIG. 11 illustrates simulation results of the relation between the offset of the boundary 26 and a propagation loss. The horizontal axis represents the offset of the boundary in the unit of "µm", and the vertical axis represents a propagation loss in the unit of "dB". An increase/decrease tendency of a propagation loss is similar to that of the first embodiment illustrated in FIG. 8. It can be understood that at least in an offset range of 0 to 5 µm, a propagation loss is smaller than that of the structure in which the buried waveguides and the high mesa waveguides are coupled to each other directly. However, an increment of a propagation loss when the offset of the boundary becomes large is larger than that of the first embodiment.

The optical waveguide device with two inputs and two outputs of the third embodiment includes the multimode interference waveguide 21 as an essential optical device. If the boundary 26 is located in such a manner that the boundary 26 intersects with the multimode interference waveguide 21, it is not necessary to newly dispose another multimode interference waveguide at the position of the boundary 26. The device is prevented from growing in length.

Figure 12A:
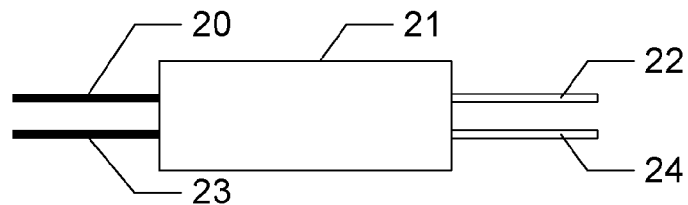
FIGS. 12A to 12F are plane views of optical waveguide devices according to modifications of the third embodiment.

FIGS. 12A to 12F illustrate various modifications having different numbers of input/output waveguides. FIG. 12A illustrates the same structure as that of the third embodiment. Two buried waveguides 20 and 23 serve as input waveguides, and two high mesa waveguides 22 and 24 serve as output waveguides.

Figure 12B:
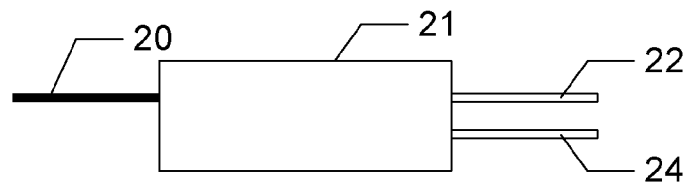
Figure 12C:
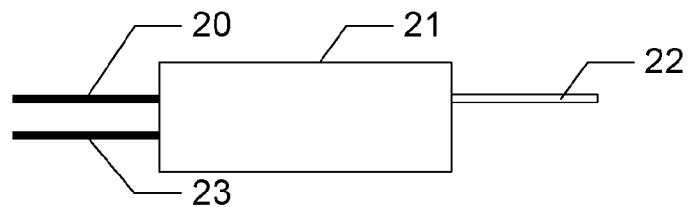

As illustrated in FIG. 12B, the device with one input and two outputs may be realizable, or as illustrated in FIG. 12C, the device with two inputs and one output may be realizable. In both the cases, the input waveguide has a buried waveguide structure, and the output waveguide has a high mesa waveguide structure.

Figure 12D:
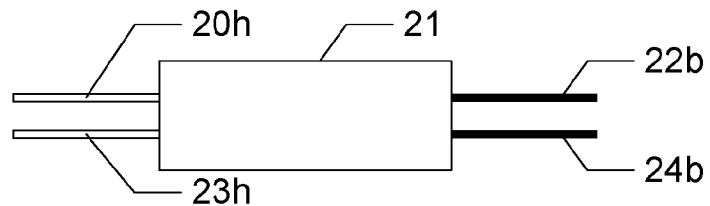
Figure 12E:
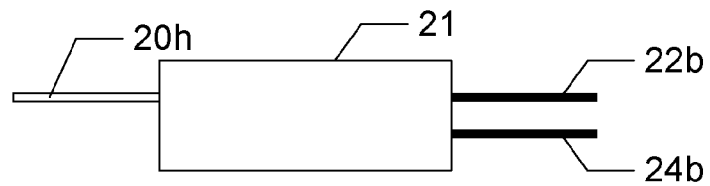
Figure 12F:
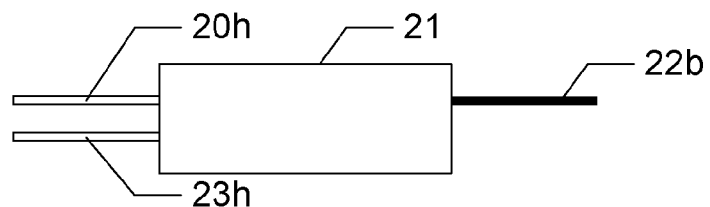

FIGS. 12D to 12F illustrate optical waveguide devices whose input waveguide has a high mesa waveguide structure and whose output waveguide has a buried waveguide structure. In the optical waveguide device illustrated in FIG. 12D, high mesa waveguides 20h and 23h serve as input waveguides, and buried waveguides 22b and 24b serve as output waveguides. As illustrated in FIGS. 12E and 12F, a device with one input and two outputs and a device with two inputs and one output may also be realizable.

A device with more than three inputs may also be realizable, or a device with more than three outputs may also be realizable.

Embodiment 4

Figure 13A:
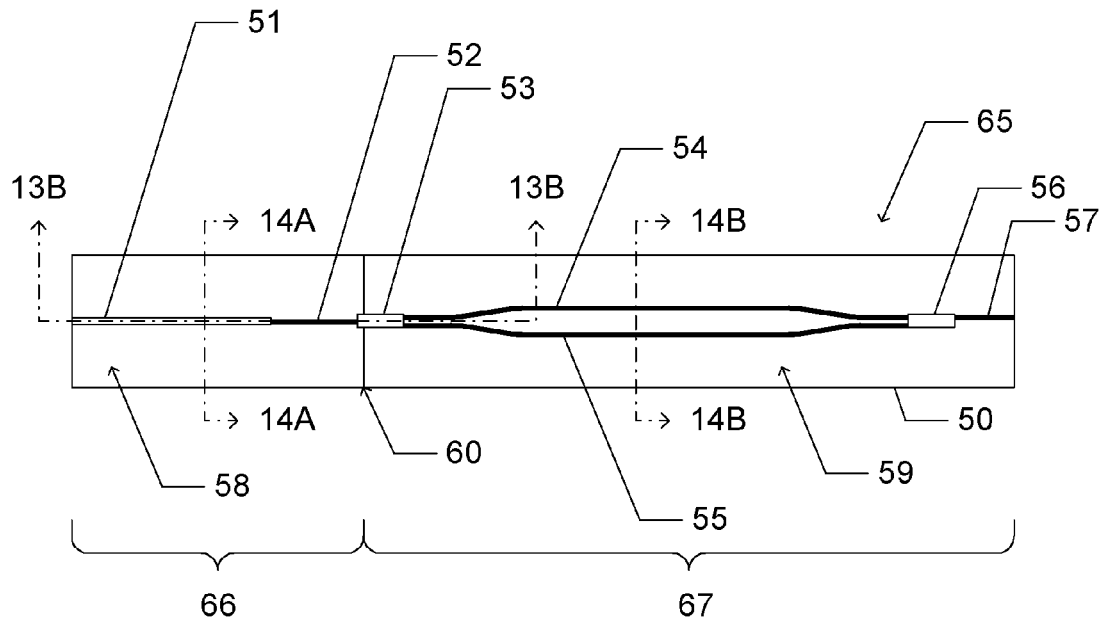
FIG. 13A is a plane view of an optical waveguide device of a fourth embodiment.

FIG. 13A is a plane view of an optical waveguide device of the fourth embodiment. A semiconductor laser device 51 and a Mach-Zehnder modulator 65 are formed on a semiconductor substrate 50. The Mach-Zehnder modulator 65 includes a multimode interference waveguide (optical splitter) 53 on the input side, a multimode interference waveguide (optical coupler) 56 on the output side, two high mesa waveguides 54 and 55 for connecting the multimode interference waveguides 53 and 56, and a high mesa waveguide 57 as an output waveguide for the optical coupler 56. The semiconductor laser device 51 and the optical splitter 53 are connected to each other by a buried waveguide 52. These optical elements have a mesa structure formed on the semiconductor substrate 50.

A boundary 60 is defined at the position displaced from the coupling position between the buried waveguide 52 and the optical splitter 53 toward the optical splitter 53. Either side of each mesa defining the waveguide of each optical element in a region (buried waveguide region) 66 extending from the boundary 60 toward the semiconductor laser device 51 is filled with a semiconductor filling material 58. Either side of each mesa defining the waveguide of each optical element in a region (high mesa waveguide region) 67 extending from the boundary 60 toward the Mach-Zehnder modulator 65 is filled with a low refractive index medium 59 having a refractive index lower than that of the filling material 58.

Figure 14A:
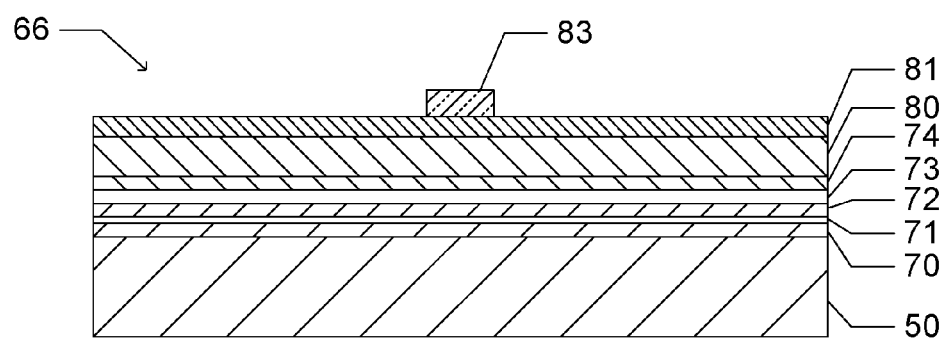
FIGS. 14A to 30B are cross sectional views illustrating the optical waveguide device of the fourth embodiment during manufacture, FIGS. 14A, 15A, 16A, 17A, 18A, 19A, 20A, 21A, 22A, 23A, 24A, 25A, 26A, 27A, 28A, 29A and 30A correspond to cross sectional views taken along one-dot chain line 14A-14A in FIG. 13A, and FIGS. 14B, 15B, 16B, 17B, 18B, 19B, 20B, 21B, 22B, 23B, 24B, 25B, 26B, 27B, 28B, 29B and 30B correspond to cross sectional views taken along one-dot chain line 14B-14B in FIG. 13A.
Figure 14B:
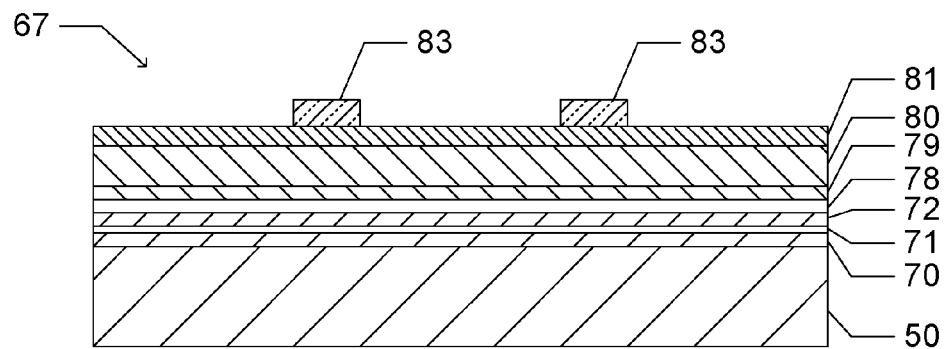
Figure 15A:
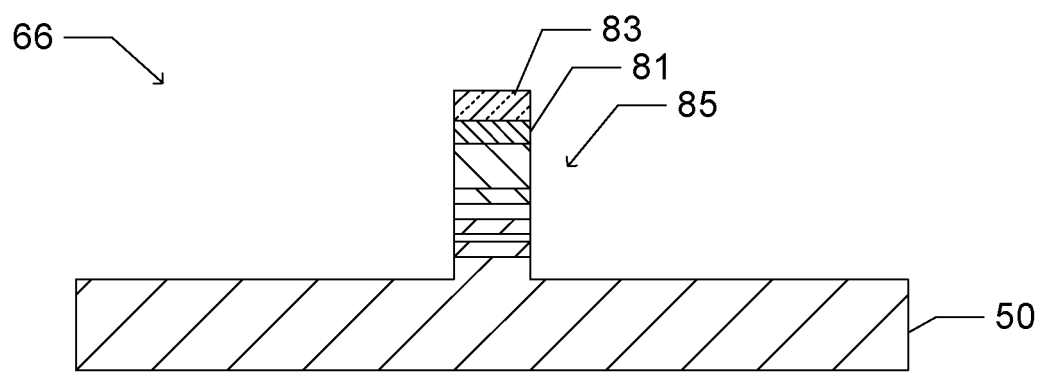
Figure 15B:
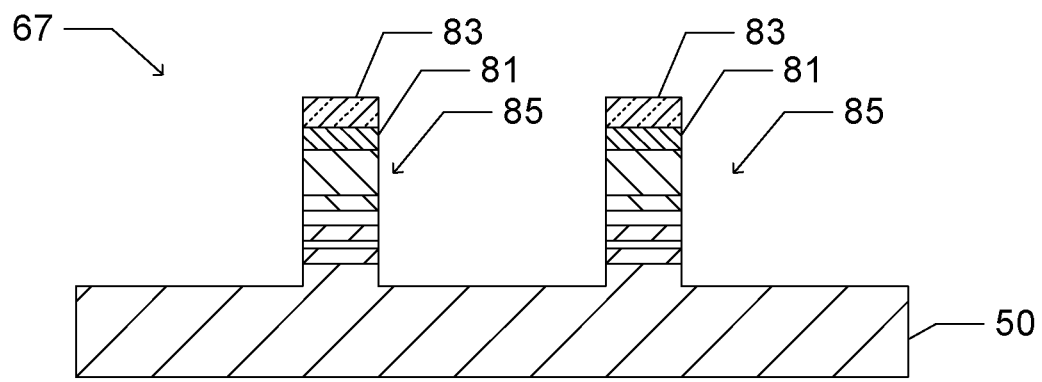

With reference to FIGS. 13B to 30B, description will be made on a manufacture method for the optical waveguide device of the fourth embodiment. FIGS. 13B to 13F are cross sectional views of the device during manufacture taken along one-dot chain line 13B-13B in FIG. 13A. FIGS. 14A, 15A, . . . , 30A are cross sectional views of the device during manufacture taken along one-dot chain line 14A-14A in FIG. 13A. FIGS. 14B, 15B, . . . , 30B are cross sectional views of the device during manufacture taken along one-dot chain line 14B-14B in FIG. 13A.

Figure 13B:
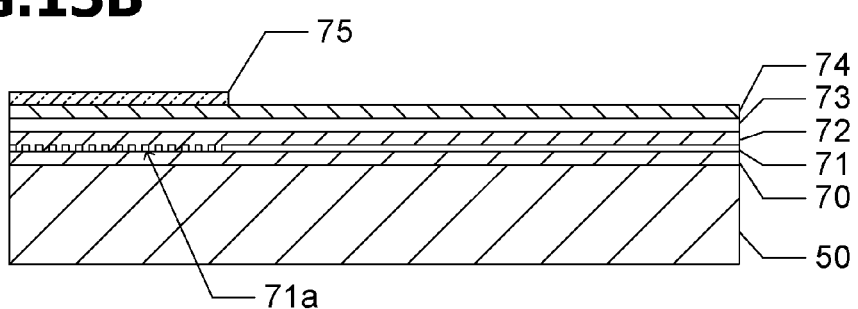
FIGS. 13B to 13F are diagrams illustrating the optical waveguide device during manufacture.

As illustrated in FIG. 13B, an n-type InP lower cladding layer 70 having a thickness of 200 nm is formed on an n-type InP semiconductor substrate 50. An n-type InGaAsP diffraction grating layer 71 having a thickness of 70 nm is formed on the lower cladding layer 70. A transition wavelength of the diffraction grating layer 71 is 1.2 μm. The diffraction grating layer 71 is patterned to form a diffraction grating 71a in a region where the semiconductor laser device 51 is to be formed. The diffraction grating 71a has periodicity in a propagation direction of guided light. A period of the diffraction grating 71a is set to 240 nm. Electron beam exposure and dry etching are adopted for patterning the diffraction grating layer 71.

An n-type InP spacer layer 72 having a thickness of 100 nm is formed on the diffraction grating layer 71. A first core layer 73 is formed on the spacer layer 72. The first core layer 73 has the lamination structure that an active layer having a multi quantum well structure is sandwiched between non-doped InGaAsP separate confinement layers each having a thickness of 15 nm. The transition wavelength of each of the separate confinement layers is 1.15 μm. The active layer includes barrier layers each having a thickness of 15 nm and well layers each having a thickness of 5.1 nm alternately stacked one upon another. The number of laminated layers is, for example, 8 cycles. The barrier layers and the well layers are made of non-doped InGaAsP. The composition of the barrier layers and the well layer is determined so that a photoluminescence (PL) wavelength of the active layer is 1.55 μm.

A p-type InP upper cladding layer 74 having a thickness of 100 nm is formed on the first core layer 73. These compound semiconductor layers are formed using MOCVD or the like.

A region of the surface of the upper cladding layer 74 extending from the coupling position between the semiconductor laser device 51 and the buried waveguide 52 toward the semiconductor laser device 51 is covered with a mask pattern 75 of silicon oxide or the like.

Figure 13C:
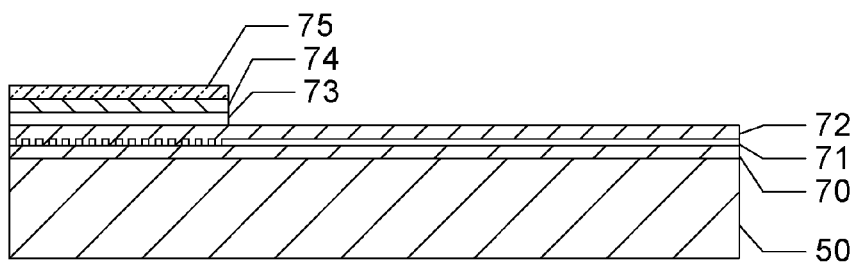

As illustrated in FIG. 13C, by using the mask pattern 75 as an etching mask, the upper cladding layer 74 and the first core layer 73 are wet etched. A part of the spacer layer 72 is therefore exposed.

Figure 13D:
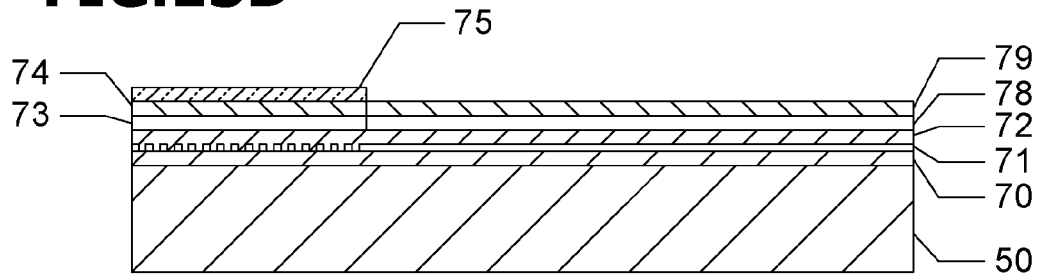
Figure 13E:
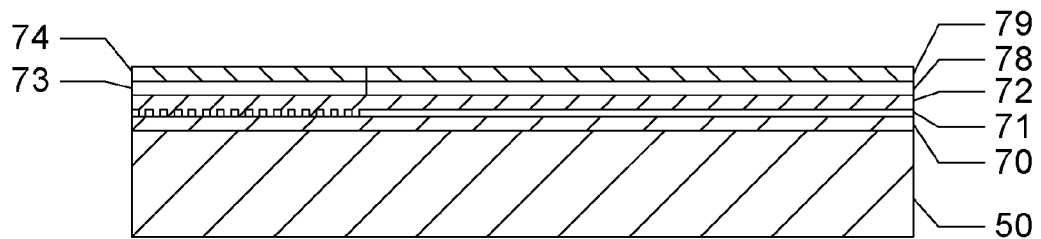

As illustrated in FIG. 13D, by using the mask pattern 75 as a selective growth mask, a second core layer 78 of non-doped InGaAsP having a thickness of 230 nm is selectively grown on the exposed spacer layer 72 by MOCVD. A transition wavelength of the second core layer 78 is set to 1.3 μm. A p-type InP upper cladding layer 79 having a thickness of 100 nm is selectively grown on the second core layer 78 by MOCVD. The first core layer 73 and the second core layer 78 are coupled to each other with a butt joint structure. After selective growth, the mask pattern 75 is removed as illustrated in FIG. 13E.

Figure 13F:
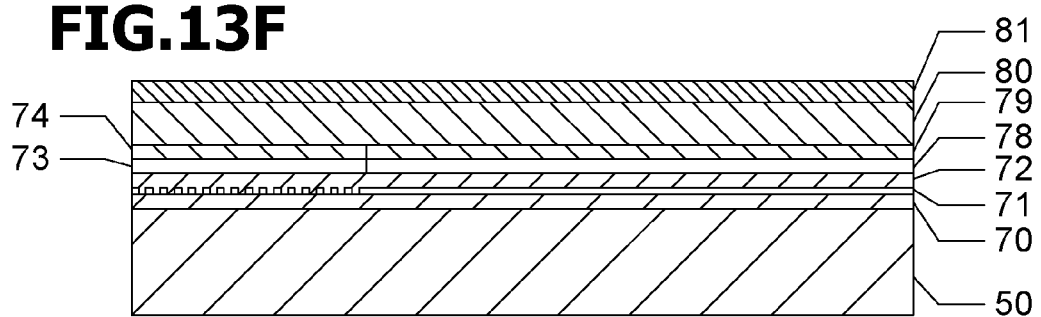

As illustrated in FIG. 13F, a p-type InP upper cladding layer 80 having a thickness of 900 nm is formed on the upper cladding layers 74 and 79. A p-type InGaAs contact layer 81 having a thickness of 300 nm is formed on the upper cladding layer 80.

As illustrated in FIGS. 14A and 14B, a mesa mask pattern 83 of silicon oxide is formed on the contact layer 81. The mesa mask pattern 83 has the same planar shape as that of a mesa defining the waveguide of each optical element illustrated in FIG. 13A. The first core layer 73 and the upper cladding layer 74 appear on the cross sectional view of FIG. 14A, and the second core layer 78 and the upper cladding layer 79 appear on the cross sectional view of FIG. 14B.

As illustrated in FIGS. 15A and 15B, by using the mesa mask pattern 83 as an etching mask, the layers from the contact layer 81 to the surface layer of the semiconductor substrate 50 are etched. A mesa 85 is therefore formed corresponding to the semiconductor laser device 51 and each of the waveguides 52 to 57 illustrated in FIG. 13A.

Figure 16A:
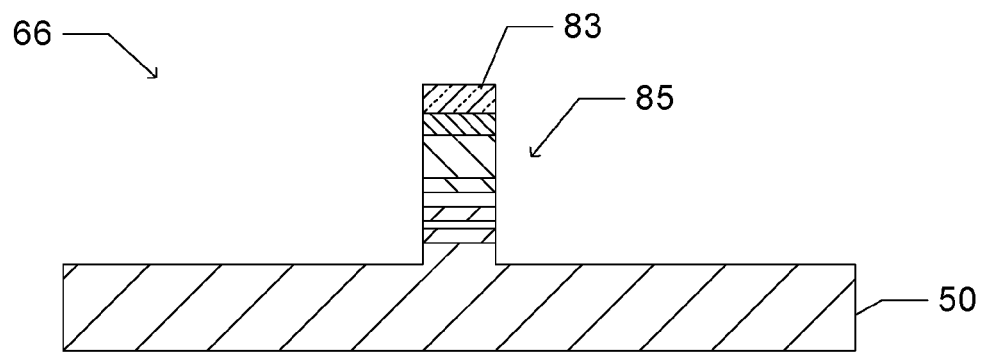
Figure 16B:
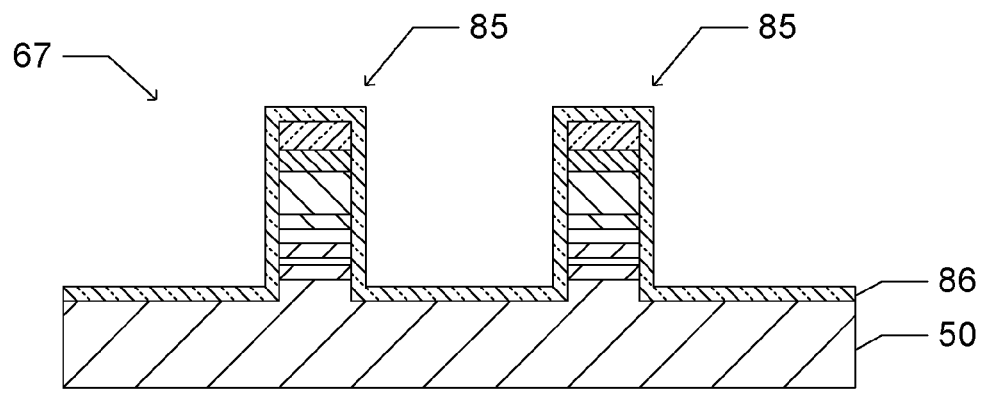

As illustrated in FIGS. 16A and 16B, a selective growth mask film 86 of silicon nitride is formed in the high mesa waveguide region 67. The selective growth mask 86 is formed by depositing a silicon nitride film on the whole surface and then patterning the silicon nitride film.

Figure 17A:
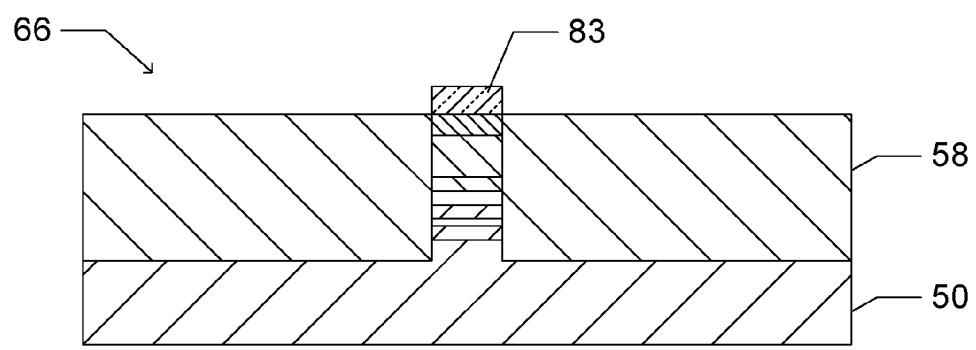
Figure 17B:
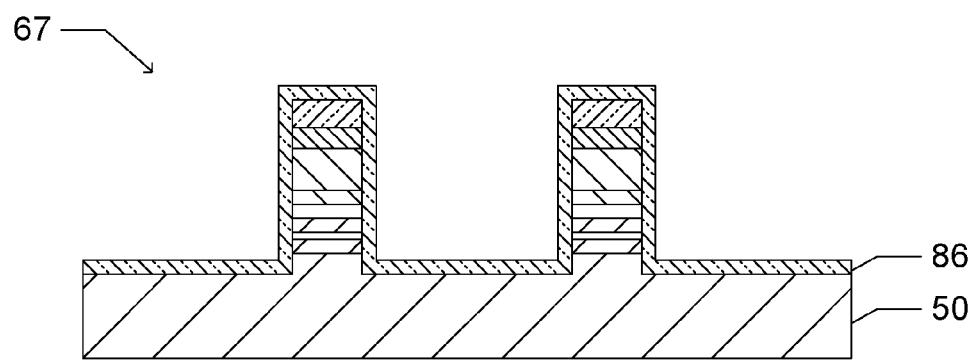
Figure 18A:
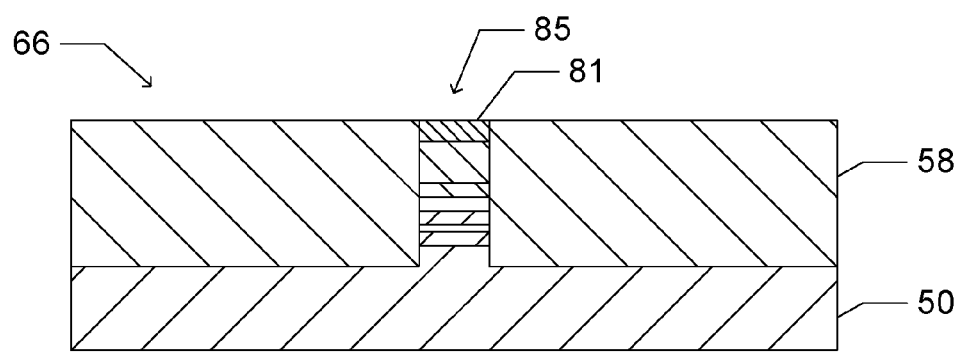
Figure 18B:
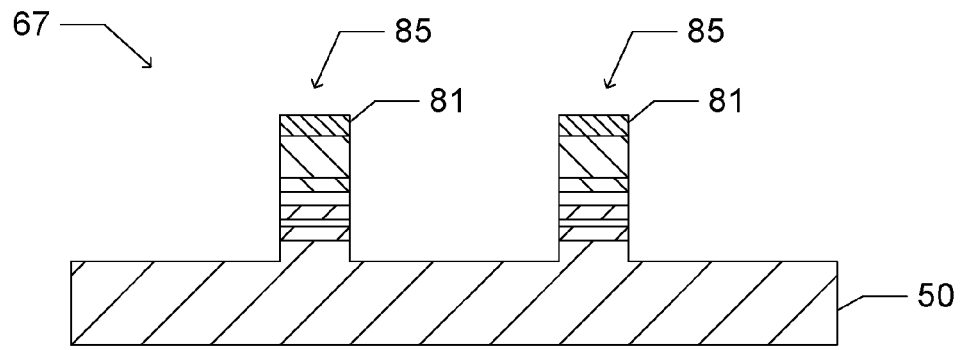

As illustrated in FIGS. 17A and 17B, by using the mesa mask pattern 83 and the selective growth mask film 86 as a mask, semi-insulating InP is selectively grown on the semiconductor substrate 50 to form a filling material 58. As illustrated in FIGS. 18A and 18B, the mesa mask pattern 83 and the selective growth mask 86 are removed. The contact layer 81 is therefore exposed on the upper surface of the mesa 85.

Figure 19A:
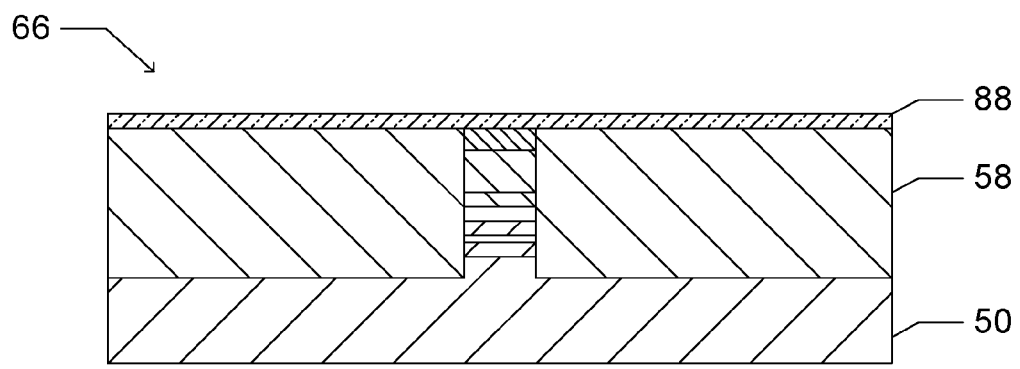
Figure 19B:
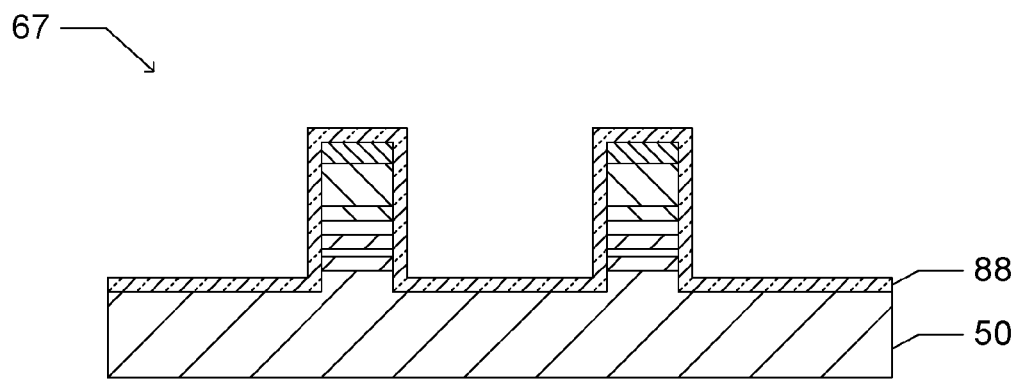
Figure 20A:
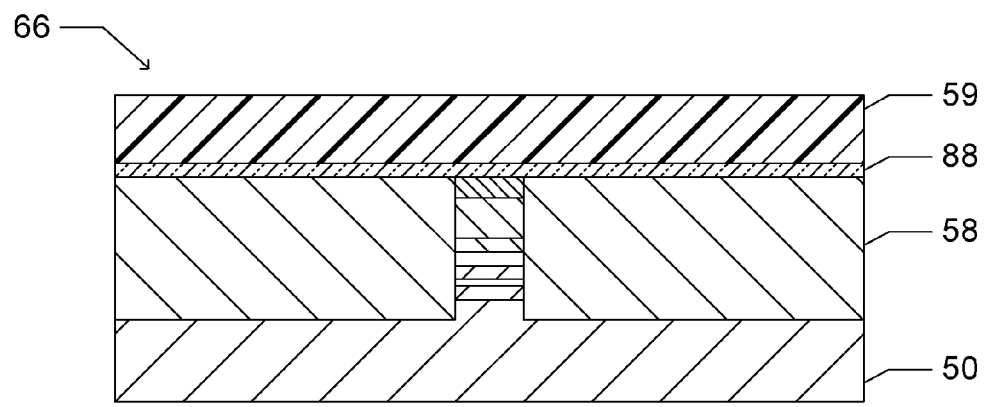
Figure 20B:
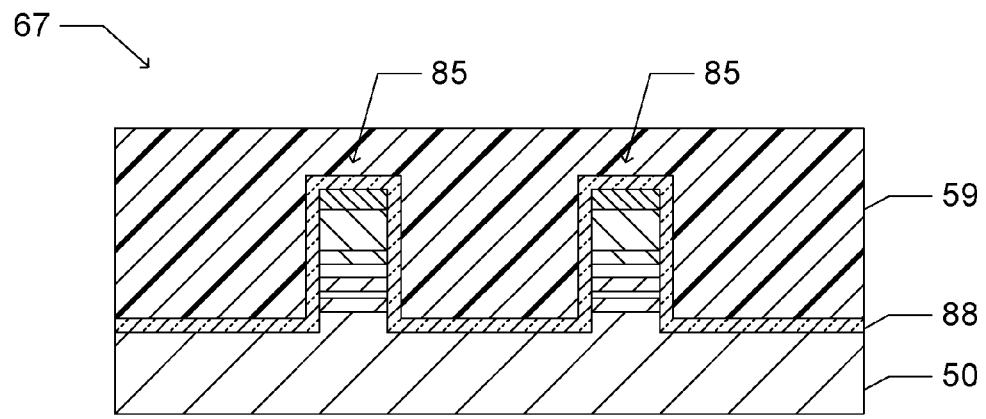

As illustrated in FIGS. 19A and 19B, a first passivation film 88 of silicon oxide is formed on the whole surface, being conformal to the underlying surface. Geometry of the underlying surface is reflected to geometry of the surface of the first passivation film 88. In other words, the geometry of the surface of the first passivation film 88 follows the geometry of the underlying surface. As illustrated in FIGS. 20A and 20B, a low refractive index medium 59 is deposited on the first passivation film 88. The low refractive index medium 59 is formed by applying benzocyclobutene in spin coating method and then performing heat treatment. Either side of the mesa 85 in the high mesa waveguide region 67 is filled with the low refractive index medium 59.

Figure 21A:
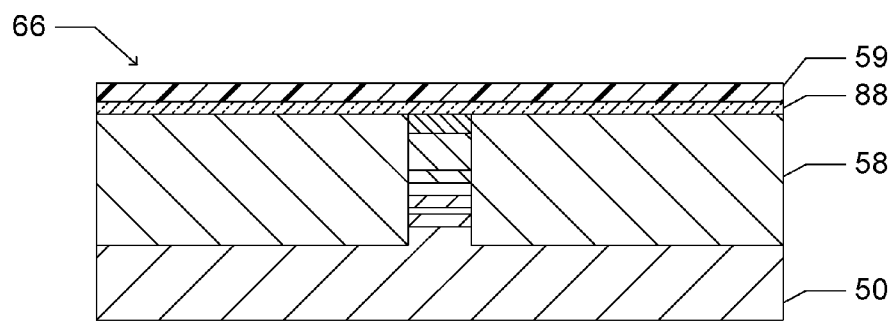
Figure 21B:
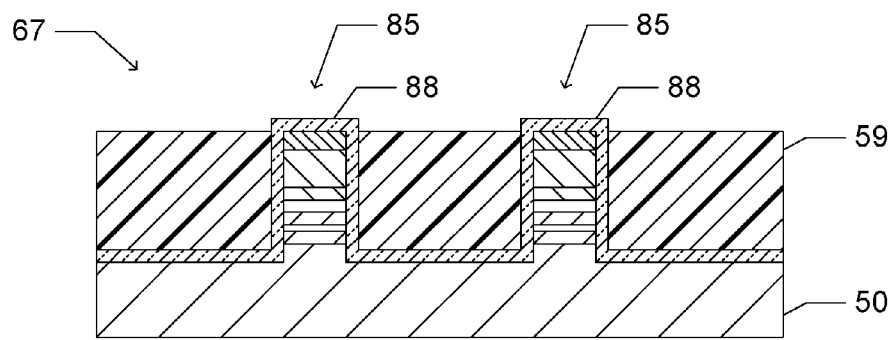

As illustrated in FIGS. 21A and 21B, the low refractive index medium 59 is etched back by dry etching until the first passivation film 88 deposited on the mesa 85 in the high mesa waveguide region 67 is exposed. In the buried waveguide region 66, the low refractive index medium 59 becomes thin.

Figure 22A:
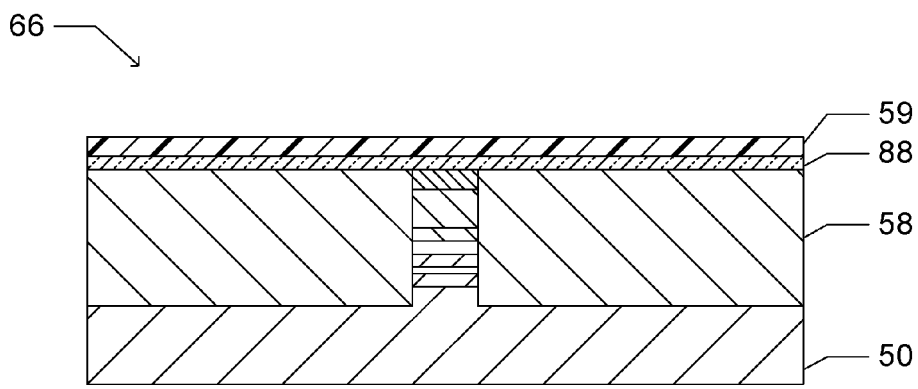
Figure 22B:
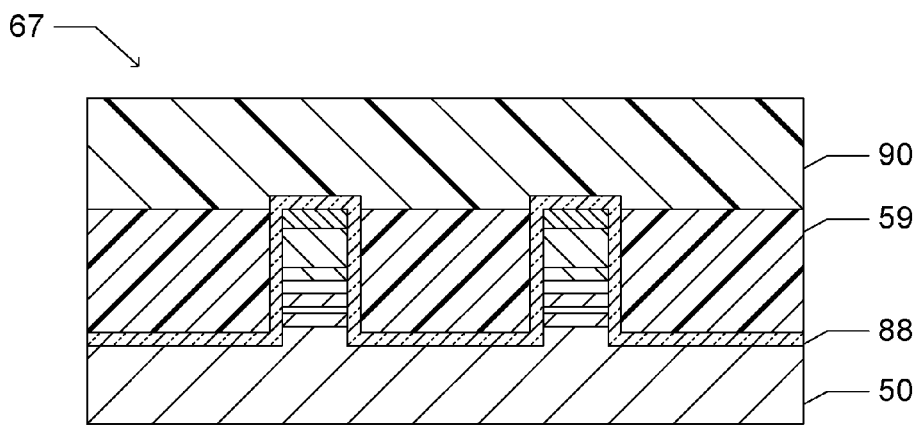
Figure 23A:
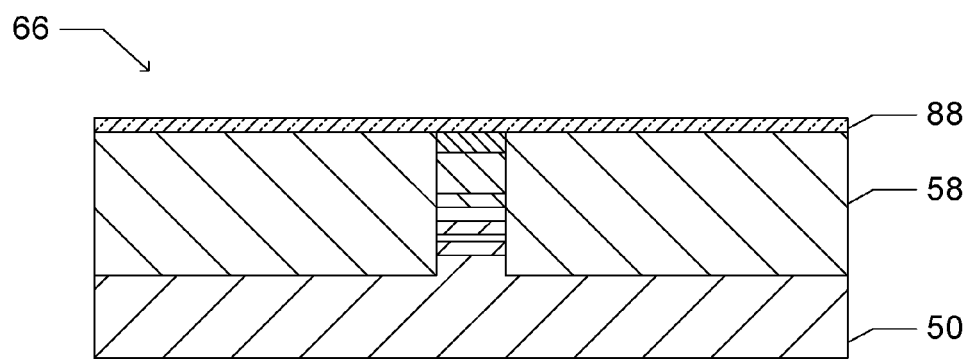
Figure 23B:
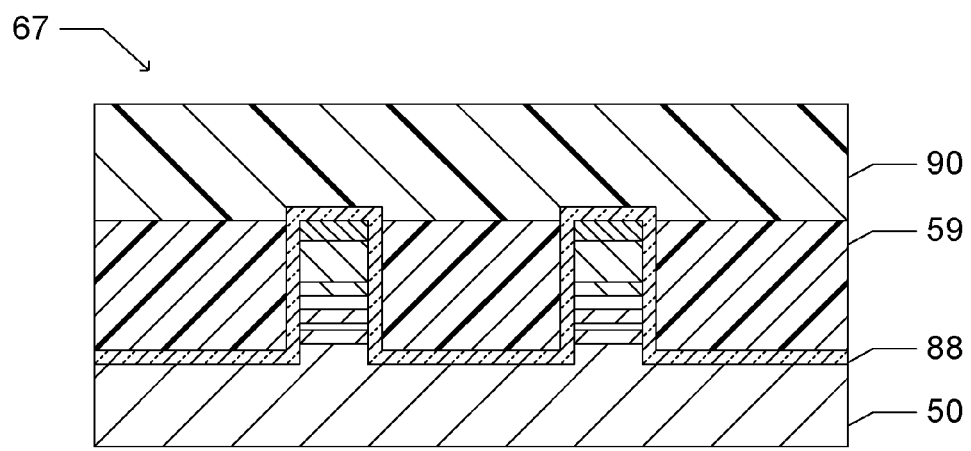
Figure 24A:
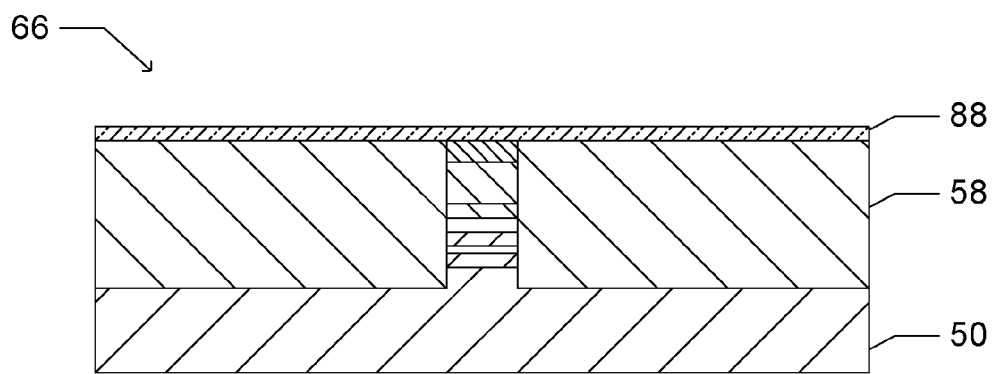
Figure 24B:
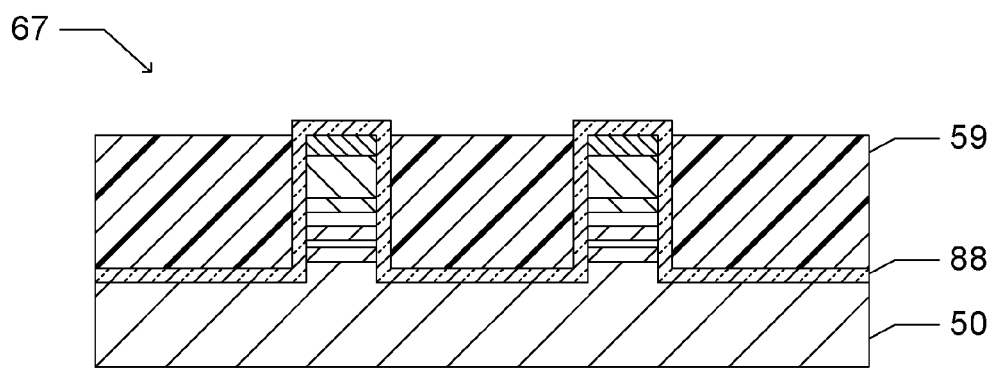

As illustrated in FIGS. 22A and 22B, the high mesa waveguide region 67 is covered with a photoresist pattern 90. As illustrated in FIGS. 23A and 23B, by using the photoresist pattern 90 as an etching mask, the low refractive index medium 59 in the buried waveguide region 66 is removed by dry etching. The first passivation film 88 is therefore exposed. As illustrated in FIGS. 24A and 24B, the photoresist pattern 90 is removed.

Figure 25A:
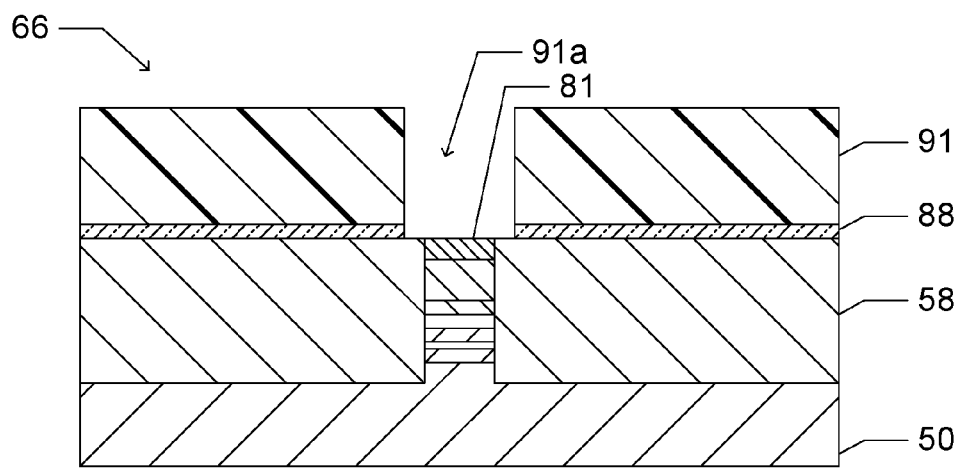
Figure 25B:
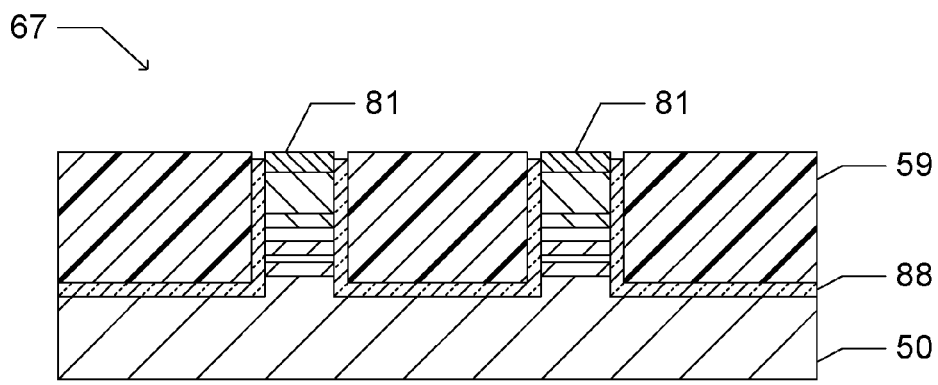

As illustrated in FIGS. 25A and 25B, the whole surface is coated with photoresist, and the photoresist is exposed and developed to form a photoresist pattern 91 in the buried waveguide region 66. The photoresist pattern 91 has an opening 91a corresponding to the mesa 85 in the buried waveguide region 66. At this stage, the low refractive index medium 59 and the first passivation film 88 on the mesa 85 are exposed in the high mesa waveguide region 67. By using the photoresist pattern 91 as an etching mask, the first passivation film 88 is etched. The contact layer 81 is exposed on the bottom of the opening 91a, and the contact layer 81 is exposed on the mesa 85 in the high mesa waveguide region 67. After the first passivation film 88 is etched, the photoresist pattern 91 is removed.

Figure 26A:
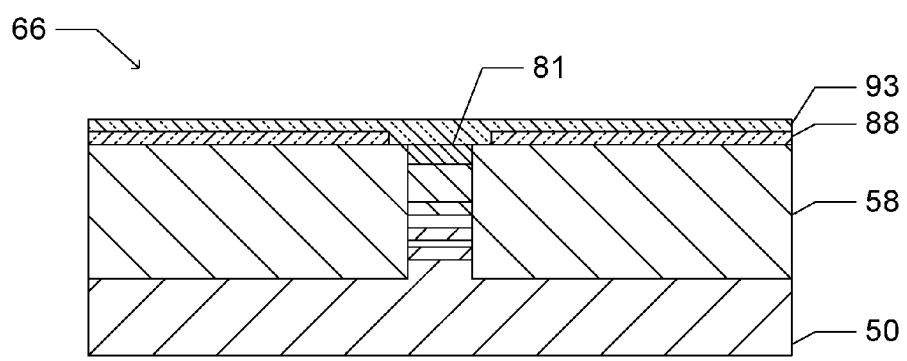
Figure 26B:
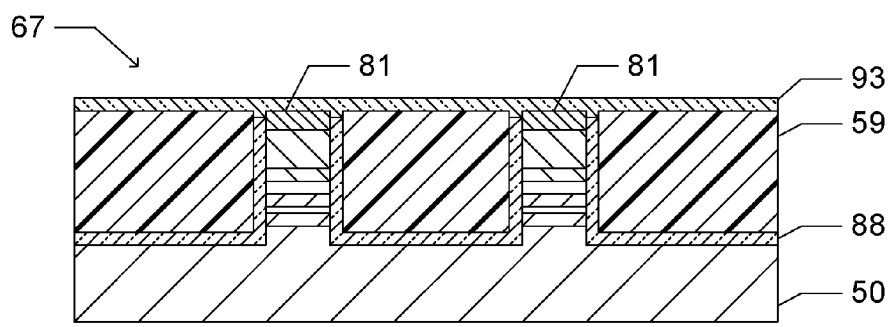
Figure 27A:
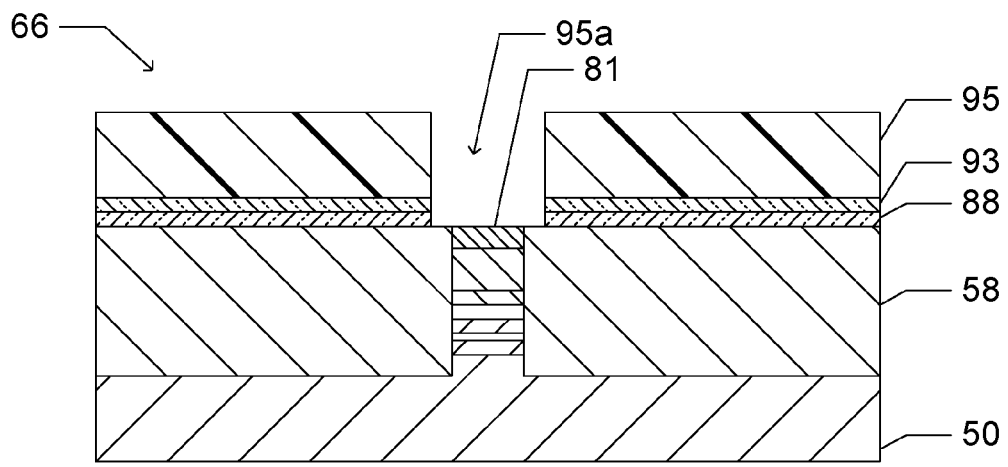
Figure 27B:
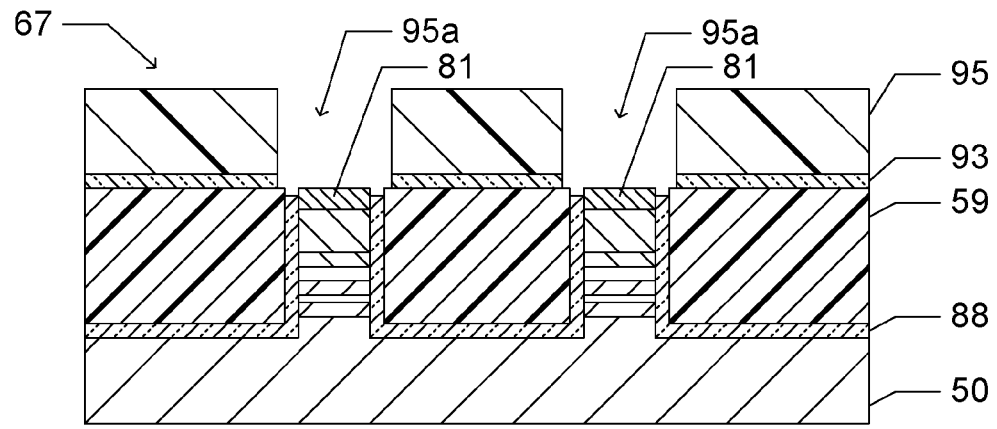

As illustrated in FIGS. 26A and 26B, a second passivation film 93 of silicon nitride is formed on the whole surface by CVD. As illustrated in FIGS. 27A and 27B, photoresist is applied to the second passivation film 93, and exposed and developed to form a photoresist pattern 95. The photoresist pattern 95 has an opening 95a corresponding to the semiconductor laser device 51 and the high mesa waveguides 54 and 55. At this stage, the second passivation film 93 is exposed on the bottom of the opening 95a.

By using the photoresist pattern 95 as an etching mask, the second passivation film 93 exposed in the opening 95a is etched. The contact layer 81 is exposed in the region where the second passivation film 93 was etched.

Figure 28A:
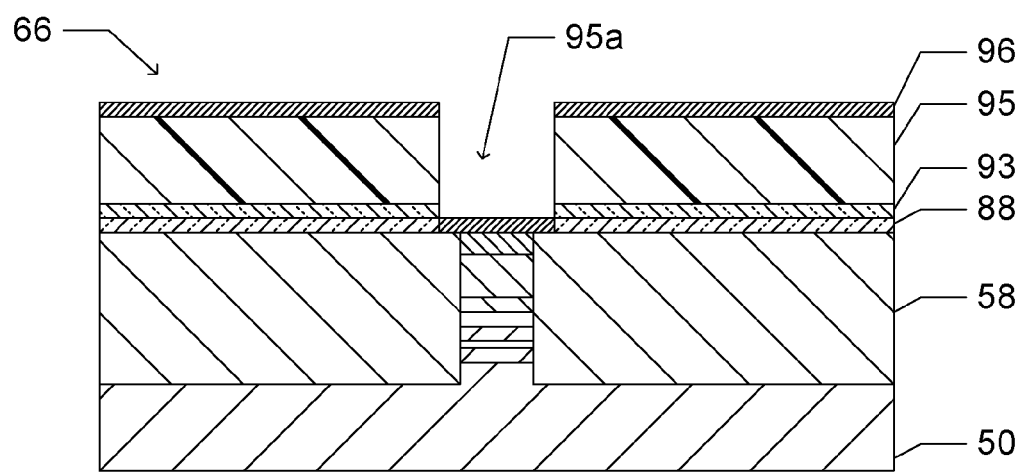
Figure 28B:
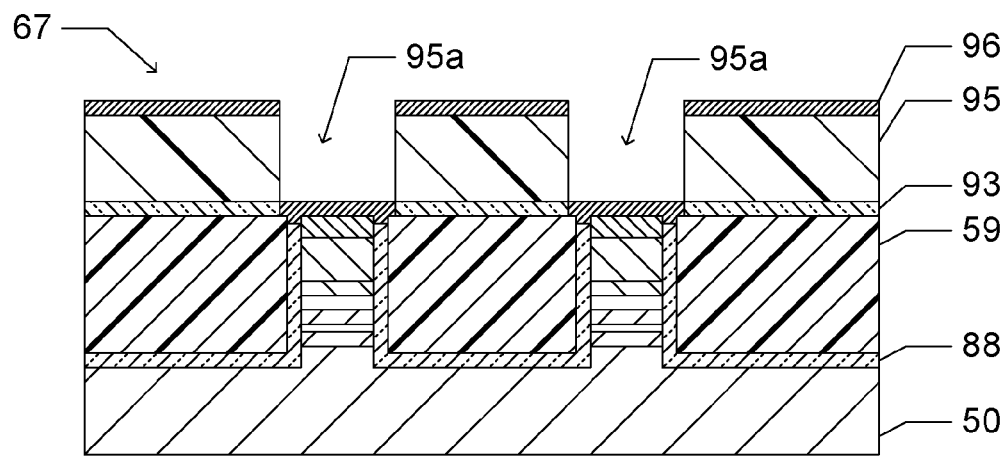
Figure 29A:
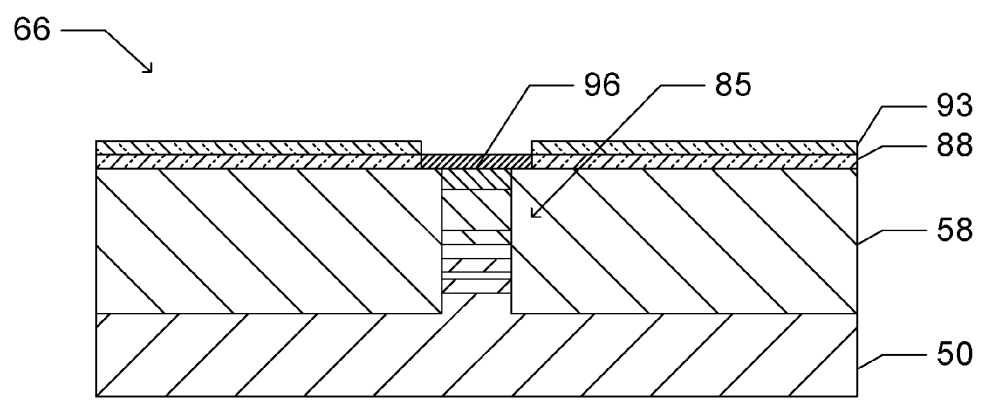
Figure 29B:
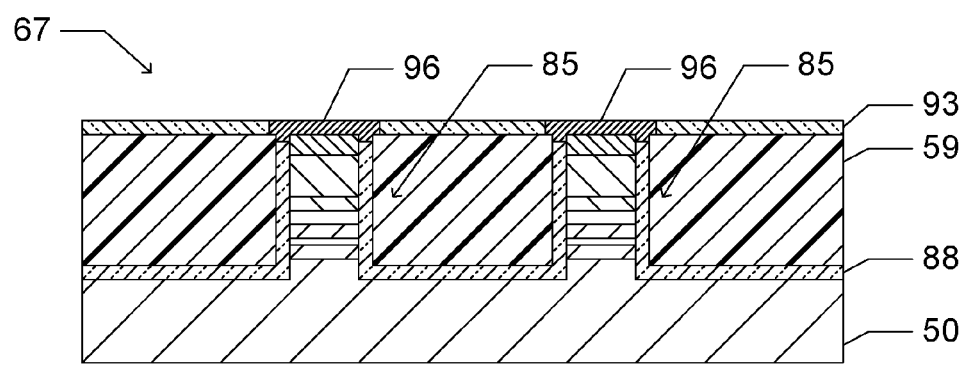

As illustrated in FIGS. 28A and 28B, Au, Zn and Au are sequentially evaporated on the upper surface of the photoresist pattern 95 and on the bottom of the opening 95a to form an upper electrode film 96. After evaporation, the photoresist pattern 95 is removed together with the upper electrode film 96 deposited on the photoresist pattern 95. As illustrated in FIG. 29A, the upper electrode film 96 is left on the mesa 85 defining the waveguide of the semiconductor laser device 51. As illustrated in FIG. 29B, the upper electrode film 96 is left on the mesa 85 defining the high mesa waveguides 54 and 55.

Figure 30A:
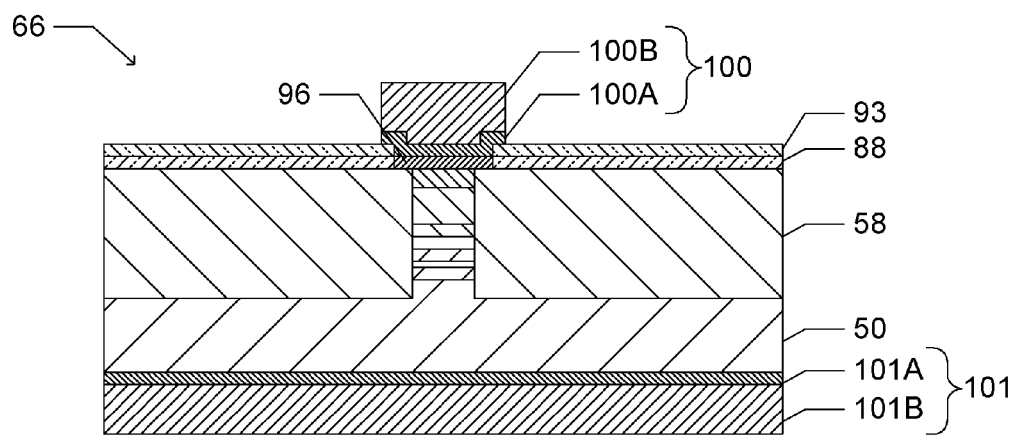
Figure 30B:
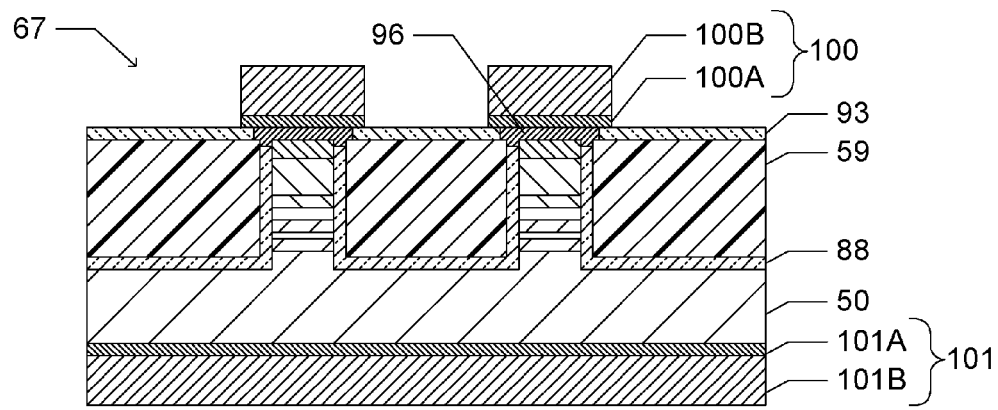

As illustrated in FIGS. 30A and 30B, an upper electrode 100 is formed on the upper electrode film 96. The upper electrode 100 includes a seed layer 100A used as an electrode for electrolytic plating and a plated layer 100B. The seed layer 100A includes three layers of Ti, Pt and Au, and the plated layer 100B is made of Au.

The bottom surface of the semiconductor substrate 50 is polished until the substrate is thinned to 150 μm. A bottom surface electrode 101 is formed on the polished surface. The bottom surface electrode 101 includes an underlying electrode layer 101A used as an electrode for electrolytic plating and a plated layer 101B on the underlying electrode layer 101A. The underlying electrode layer 101A includes two layers of AuGe and Au, and the plated layer 101B is made of Au.

After the upper electrode 100 and the bottom surface electrode 101 are formed, heat treatment is performed to alloy the interface between the contact layer 81 and the upper electrode film 96 and the interface between the semiconductor substrate 50 and the underlying electrode layer 101A to achieve good ohmic contacts.

In the fourth embodiment, the optical splitter 53 for coupling the buried waveguide 52 illustrated in FIG. 13A to the high mesa waveguides 54 and 55 intersects with the boundary 60 between the buried waveguide region 66 and the high mesa waveguide region 67. The optical splitter 53 corresponds to the multimode interference waveguide having one input and two outputs structure illustrated in FIG. 12B. As the positional relationship between the optical splitter 53 and the boundary 60 are made to be the same as that between the multimode interference waveguide 21 and the boundary 26 of the first embodiment, it becomes possible to suppress an increase in a propagation loss of guided light propagating from the buried waveguide 52 to the high mesa waveguides 54 and 55.

The Mach-Zehnder modulator 65 is essentially equipped with the optical splitter 53. It is therefore unnecessary to newly dispose an optical element for exclusive use (element corresponding to the multimode interference waveguide 21 of the first embodiment illustrated in FIG. 1) to be disposed intersecting the boundary 60. It is therefore possible to prevent the device from being increased in length.

In the fourth embodiment, although the semiconductor laser device 51 and the Mach-Zehnder modulator 65 are integrated on a single substrate, another optical functional element may be integrated. For example, a semiconductor optical amplifier having a buried waveguide structure may be disposed between the semiconductor laser device and the Mach-Zehnder modulator. Instead of the Mach-Zehnder modulator, an electric field absorption (EA) type optical modulator having a high mesa waveguide structure may be disposed. In the embodiment 4, the DFB laser is used as the semiconductor laser device 51. A wavelength variable laser, e.g., super structure grating distributed Bragg reflector (SSG-DBR) laser, a tunable distributed amplification DFB (TDA-DFB) laser, or a chirped sampled grating DBR (CSG-DBR) laser, may be used as the semiconductor laser device 51 instead of the DFB laser.

In the fourth embodiment, although the high mesa waveguide 57 is used as the output waveguide of the optical coupler 56, the output waveguide may have the buried waveguide structure. In this case, the optical coupler 56 corresponds to the multimode interference waveguide having the two inputs and one output structure illustrated in FIG. 12F.

Embodiment 5

Figure 31:
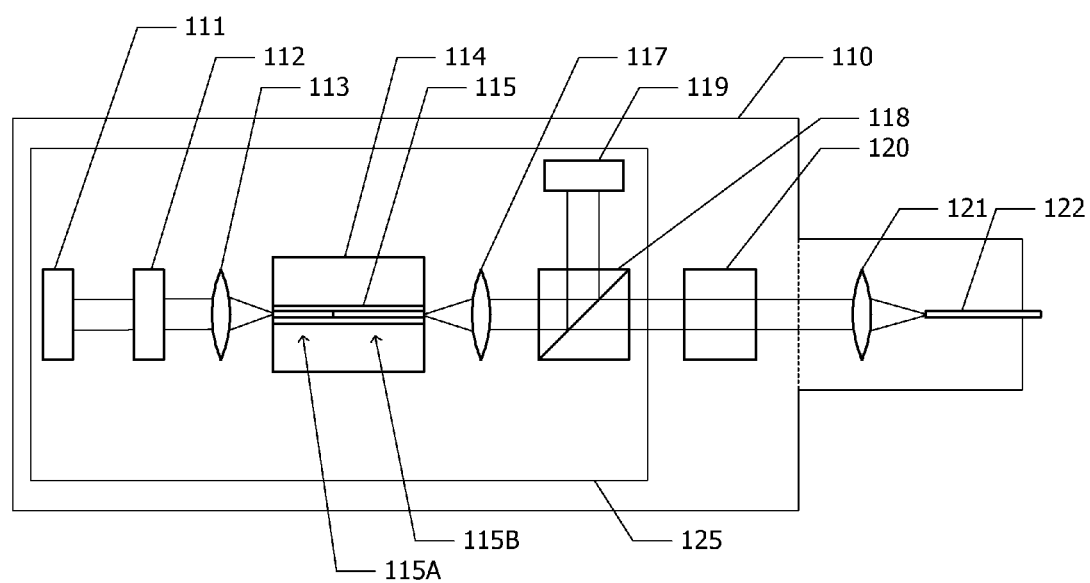
FIG. 31 is a plane view of an optical semiconductor module of a fifth embodiment using the optical waveguide device of each of the first to fourth embodiments.

FIG. 31 is a plane view of an optical semiconductor module (laser module) of the fifth embodiment.

A modulator integrated laser device 115 is mounted on a chip carrier 114. The optical waveguide device of, for example, the fourth embodiment is used as the modulator integrated laser device 115. The modulator integrated laser device 115 includes a buried laser portion 115A having the buried waveguide structure and a high mesa modulator portion 115B having the high mesa waveguide structure.

An optical signal output from the buried laser portion 115A and modulated by the high mesa modulator portion 115B is collimated by a collimation lens 117, and input to a beam splitter 118. The beam splitter 118 branches the optical signal to two optical signals propagating different paths. One branched optical signal is input to a photodetector 119 for an output monitor. The other branched optical signal passes through an isolator 120, is converged by a convergence lens 121, and is input to an optical fiber 122.

An optical beam output from the back facet of the buried laser portion 115A is collimated by a collimation lens 113, passes through an etalon 112, and is input to a photodetector 111 for a wavelength monitor.

The chip carrier 114, collimation lenses 113 and 117, etalon 112, photodetectors 111 and 119 and beam splitter 118 are disposed on a Peltier device 125. The Peltier device 125, isolator 120, convergence lens 121 and an input end portion of the optical fiber 122 are accommodated in a case 110. The optical fiber 122 is extended out of the case 110.

In the fifth embodiment, since the buried waveguide structure is adopted for the buried laser portion 115A, reliability and stability of the buried laser portion 115A are able to be improved. Since the high mesa waveguide structure is adopted for the high mesa modulator portion 115B, the modulator portion is able to be downsized and an increase in a loss is able to be suppressed.

Embodiment 6

Figure 32:
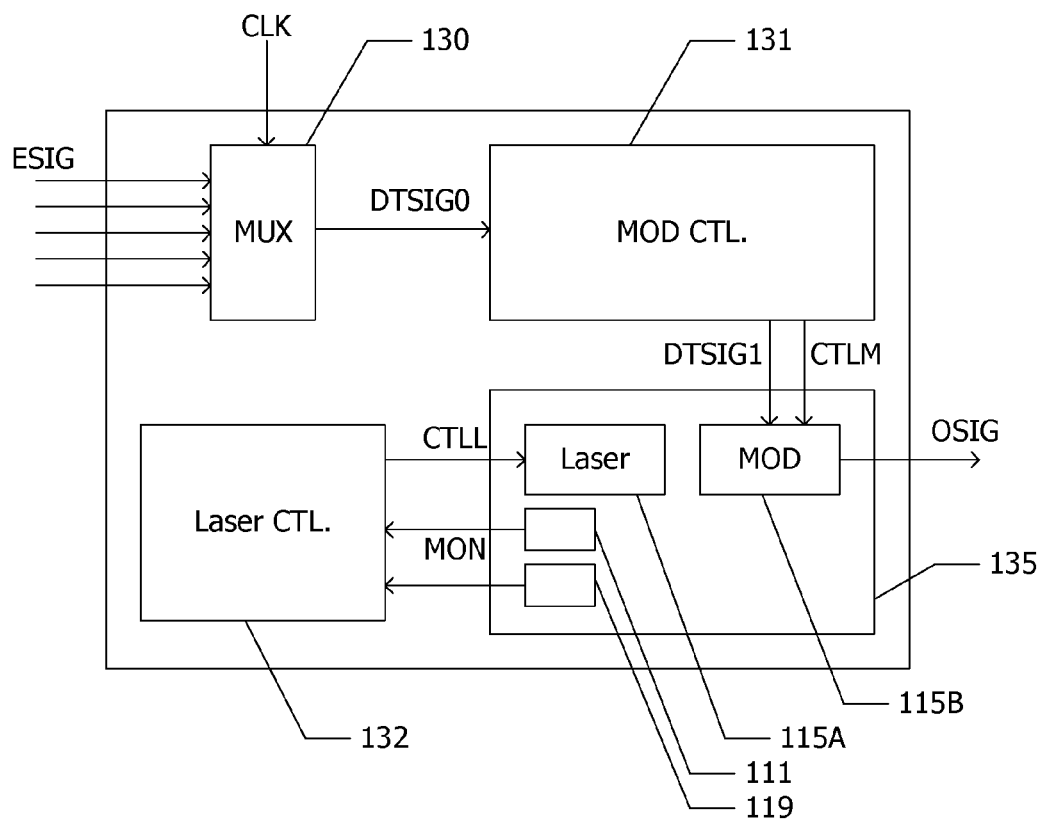
FIG. 32 is a block diagram of an optical transmission system of a sixth embodiment using the optical semiconductor module of the fifth embodiment.

FIG. 32 is a block diagram of an optical transmission system of the sixth embodiment. This optical transmission system includes a multiplexer 130, a modulator control circuit 131, a laser control circuit 132 and an optical semiconductor module 135. The optical semiconductor module of, for example, the fifth embodiment illustrated in FIG. 31 is used as the optical semiconductor module 135. The optical semiconductor module 135 includes a laser portion 115A, a modulator portion 115B, a photodetector 111 for a wavelength monitor and a photodetector 119 for an output monitor.

Electric signals ESIG input to the multiplexer 130 and a clock signal CLK generate a time divisionally multiplexed data signal DTSIG0. In accordance with the input data signal DTSIG0, the modulator control circuit 131 generates a data signal DTSIG1 and a control signal CTLM for intensity modulating a laser beam, and transmits the signals to the modulator portion 115B.

The laser control circuit 132 receives monitor information MON from the photodetectors 111 and 119 and generates a control signal CTLL. The control signal CTLL drives the laser portion 115A.

In the sixth embodiment, the optical semiconductor module of the fifth embodiment is adopted for an optical transmitter of the optical transmission system. Therefore, reliability and stability of the optical transmitter are able to be improved. Further, operation speed of the optical transmitter is able to be high and the optical transmitter is able to be downsized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An optical waveguide device comprising:
  a first optical waveguide of a mesa shape formed over a substrate, either side of the first optical waveguide being filled with a filling material;
  a second optical waveguide of a mesa shape formed over the substrate, either side of the second optical waveguide not being filled with the filling material; and
  a multimode interference waveguide of a mesa shape formed over the substrate for optically coupling the first optical waveguide to the second optical waveguide,
  wherein a boundary between a region where the filling material is disposed and a region where the filling material is not disposed is located at a position between a contact point between the first optical waveguide and the multimode interference waveguide and a contact point between the multimode interference waveguide and the second optical waveguide.

2. The optical waveguide device according to claim 1, wherein the either side of the second optical waveguide are filled with a low refractive index medium having a refractive index lower than a refractive index of the filling material.

3. The optical waveguide device according to claim 1, wherein an offset of the boundary from the contact point between the first optical waveguide and the multimode interference waveguide is equal to or smaller than 11 μm.

4. The optical waveguide device according to claim 1, wherein the second optical waveguide comprises a region becoming narrower with distance from the contact point between the second optical waveguide and the multimode interference waveguide.

5. The optical waveguide device according to claim 1, wherein a width of the second optical waveguide at a contact point between the second optical waveguide and the multimode interference waveguide is wider than a width of the first optical waveguide at a contact point between the first optical waveguide and the multimode interference waveguide.

6. The optical waveguide device according to claim 1, further comprising a third optical waveguide of a mesa shape formed over the substrate, connected to the multimode interference waveguide, and optically coupled to the first optical waveguide via the multimode interference waveguide, wherein either side of the third optical waveguide are filled with a low refractive index medium having a refractive index lower than a refractive index of the filling material.

7. The optical waveguide device according to claim 1, further comprising a fourth optical waveguide of a mesa shape formed over the substrate, connected to the multimode interference waveguide, and optically coupled to the second optical waveguide via the multimode interference waveguide, wherein either side of the fourth optical waveguide are filled with the filling material.

8. An optical waveguide device comprising:
  a semiconductor laser comprising a first optical waveguide of a mesa shape formed over a substrate;
  an optical modulator comprising a second optical waveguide of a mesa shape formed over the substrate;
  a multimode interference waveguide of a mesa shape for optically coupling the first optical waveguide to the second optical waveguide; and
  a filling material disposed on either side of the first optical waveguide but not disposed on either side of the second optical waveguide,
  wherein a boundary between a region where the filling material is disposed and a region where the filling material is not disposed is located at a position between a contact point between the first optical waveguide and the multimode interference waveguide and a contact point between the multimode interference waveguide and the second optical waveguide.

9. A laser module comprising an optical waveguide device, the optical waveguide device comprising:
- a semiconductor laser comprising a first optical waveguide of a mesa shape formed over a substrate;
- an optical modulator comprising a second optical waveguide of a mesa shape formed over the substrate;
- a multimode interference waveguide of a mesa shape for optically coupling the first optical waveguide to the second optical waveguide; and
- a filling material disposed on either side of the first optical waveguide but not disposed on either side of the second optical waveguide,
- wherein a boundary between a region where the filling material is disposed and a region where the filling material is not disposed is located at a position between a contact point between the first optical waveguide and the multimode interference waveguide and a contact point between the multimode interference waveguide and the second optical waveguide.

10. An optical transmission system comprising an optical waveguide device, the optical waveguide device comprising:
- a semiconductor laser comprising a first optical waveguide of a mesa shape formed over a substrate;
- an optical modulator comprising a second optical waveguide of a mesa shape formed over the substrate;
- a multimode interference waveguide of a mesa shape for optically coupling the first optical waveguide to the second optical waveguide; and
- a filling material disposed on either side of the first optical waveguide but not disposed on either side of the second optical waveguide,
- wherein a boundary between a region where the filling material is disposed and a region where the filling material is not disposed is located at a position between a contact point between the first optical waveguide and the multimode interference waveguide and a contact point between the multimode interference waveguide and the second optical waveguide.

* * * * *